US006310707B1

(12) United States Patent
Kawase et al.

(10) Patent No.: US 6,310,707 B1
(45) Date of Patent: Oct. 30, 2001

(54) OPTICAL WIRELESS DATA COMMUNICATION SYSTEM, AND TRANSMITTER AND RECEIVER USED THEREFOR

(75) Inventors: Takeo Kawase; Takeo Kaneko; Takayuki Kondo; Shojiro Kitamura, all of Suwa (JP)

(73) Assignee: Seiko Epson Corporation, Tokyo (JP)

(*) Notice: Subject to any disclaimer, the term of this patent is extended or adjusted under 35 U.S.C. 154(b) by 0 days.

(21) Appl. No.: 08/956,294

(22) Filed: Oct. 23, 1997

(30) Foreign Application Priority Data

Oct. 25, 1996 (JP) ................................. 8-284483

(51) Int. Cl.[7] .................................................. H04B 10/00
(52) U.S. Cl. ..................... 359/156; 359/132; 359/133; 359/122; 359/181; 359/185; 359/152; 359/172; 359/192; 359/193
(58) Field of Search ................................ 359/122, 132, 359/133, 181, 156, 185, 152, 172, 193, 192

(56) References Cited

U.S. PATENT DOCUMENTS

| | | | | |
|---|---|---|---|---|
| 4,584,719 | * | 4/1986 | Miller ................................. | 455/608 |
| 5,138,475 | * | 8/1992 | Bergmann et al. ................. | 359/118 |
| 5,331,654 | * | 7/1994 | Jewell et al. ....................... | 372/45 |
| 5,412,680 | * | 5/1995 | Swirhun et al. .................... | 372/45 |
| 5,530,577 | * | 6/1996 | Orino et al. ........................ | 359/152 |
| 5,648,978 | * | 7/1997 | Sakata ................................. | 372/50 |
| 5,710,652 | * | 1/1998 | Bloom et al. ...................... | 359/152 |
| 5,727,014 | * | 3/1998 | Wang et al. ........................ | 372/96 |
| 5,742,418 | * | 4/1998 | Mizutani et al. ................... | 359/156 |
| 5,778,018 | * | 7/1998 | Yoshikawa et al. ................ | 372/45 |
| 5,808,763 | * | 9/1998 | Duck et al. ......................... | 359/127 |
| 5,822,096 | * | 10/1998 | Redmond et al. .................. | 359/129 |
| 5,909,296 | * | 6/1999 | Tsacoyeanes ....................... | 359/152 |
| 6,014,479 | * | 1/2000 | Darcie ................................. | 385/24 |
| 6,043,922 | * | 3/2000 | Koga et al. ......................... | 359/193 |

FOREIGN PATENT DOCUMENTS

| | | |
|---|---|---|
| 7-273726 | 10/1995 | (JP) . |
| 07273726 | * 10/1995 | (JP) ................................. 359/152 |

* cited by examiner

*Primary Examiner*—Leslie Pascal
*Assistant Examiner*—Hanh Phan
(74) *Attorney, Agent, or Firm*—Oliff & Berridge PLC

(57) ABSTRACT

Based on binary transmission data 12, a receiver 11 emits electromagnetic waves 13 with modulated plane of polarization into a free space 16. The data propagates along the free space 16 as the azimuth of the plane of polarization. A receiver 17 accepts the electromagnetic wave 13 with modulated plane of polarization discriminates the data based on the state of the plane of polarization, and outputs the binary received data 18. The data and the clock data are transmitted from a plurality of light-emitting units with different polarization states or wavelengths to omit PLL circuits.

16 Claims, 20 Drawing Sheets

PLANAR VIEW

CROSS SECTION
ALONG A-A'

OPTICAL WIRELESS DATA COMMUNICATION SYSTEM, AND TRANSMITTER AND RECEIVER USED THEREFOR

BACKGROUND OF THE INVENTION

1. Field of the Invention

The present invention relates to an optical wireless communication system for performing wireless communication in free space by using light, and a transmitter and receiver used for this system.

2. Related Art

In order to realize movable communication with multimedia functions, radio communication with higher transfer rates is required, and there is a need to develop new frequencies. In the field of radio waves, development is proceeding which aims at realizing radio communication with submillimeter and millimeter waves. On the other hand, there is also an expanded utilization of infrared rays in the field of radio communication, although they are not regulated by the law as radio waves.

Using infrared rays, namely a wide band which is not under restriction as radio waves in the field of optical wireless data communication, the provision of high speed data communication may be possible. As light is characterized by not penetrating non-transparent objects such as walls, it is suitable for use in wireless LANs of individual room or for short distance data communication. At present, the most typical wireless communication system using infrared rays is the IrDA (Infrared Data Association) system. This system is composed of an infrared light-emitting diode and a light-acceptor, and realize data exchange at high speeds from 115.2 kbps to 4 Mbps. The communication distance is short, namely 1 m or less, but the greatest characteristic is that it can provide wireless data communication at low costs.

In the future, the demand will grow for an optical wireless data communication system with a larger transmission capacity and greater communication distance. However, when using light-emitting diodes as the light source, the light emitted from the light-emitting diode has a wavelength width of 100 nm or more, so the effective utilization of the band is ineffective. Furthermore, due to the long life time of carriers in LEDs, a modulation exceeding 100 MHz is difficult. In order to solve these problems, it is effective to use semiconductor lasers as the light source. By using a semiconductor laser, a wavelength width of 1 nm or less is easily obtained, and modulation to 1 GHz or more is principally also possible. However, there is the problem that errors may be caused by crosstalk. As light is not subject to legal restriction as radio carrier waves, it can be used without restriction, but the disadvantage may arise in that optical wireless equipment which utilize the same wavelength will mutually interfere. For example, existing optical wireless data communication systems such as the IrDA system utilize wavelengths from 850 nm to 900 nm, as their peak wavelengths. Even if a communication device using semiconductor lasers which provides high speed transmission and long communication distances were realized, using any of the wavelengths from 850 nm to 900 nm would lead to interference with the IrDA system. As the IrDA system is widely used with existing computers, the interference must be avoided in practice, even though it may not be a legal problem.

In order to prevent the interference, the wavelengths need to be selected so as not to overlap with the wavelengths already in use. For example, in order to avoid interference with the IrDA, it is effective to use a wavelength of 1 $\mu$m or more. However, the problem is the related cost. In order to utilize wavelengths of 1 $\mu$m or more, there is the need to use an InGaAsP mixed crystal formed on an InP substrate as the transmitting semiconductor laser. This substrate is more expensive than a GaAs substrate and increasing the diameter is difficult. Therefore, this system is less cost effective than those systems which use wavelengths of 900 nm or less which can use the GaAs substrate. Furthermore, PIN photodiodes for receiver can be cost problems as well. The reason is that PIN photodiodes made of silicon are limited to using only wavelengths of 1 $\mu$m or less. It has no sensitivity in wavelengh range exceeding this limit. With wavelengths exceeding 1 $\mu$m, a PIN photodiode made of InGaAs formed on an InP substrate is necessary. As material and production costs for this element highly exceed those made of silicon, a light detector whose area is comparatively large will cause a large cost difference.

Accordingly, the realization of high-speed optical wireless data communication utilizing semiconductor lasers is difficult due to the increased cost in making an approach of using long wavelengths of 1 $\mu$m or more to prevent interference with existing optical wireless data communication systems.

There is also an additional problem in providing an optical wireless data communication system at low costs. A clock synchronized with the received data is necessary to reproduce the received data from the received light. Conventional optical wireless data communication systems extract the clock via a PLL (Phase Locked Loop) circuit from an electric signal obtained by photoelectrically converting the received light. The stable operation of this PLL circuit required high precision circuits and stable power sources, which became factors for raising the cost. It also required the modulation into RLL-type (Run Length Limited: limited number of bits in which "1" and "0" follow successively) modulated codes during the transmission so as to allow easy extraction of the clock from the received light. The modulation and demodulation circuits were other factors for raising the cost.

SUMMARY OF THE INVENTION

The present invention aims at providing an inexpensive optical wireless data communication system which is little affected by disturbing light, which does not affect existing optical wireless communication systems, and which is not affected by existing optical wireless communication systems. Another object of the present invention is to provide an optical wireless data communication system which does not interfere with the IrDA system even when performing light modulation communication using a wavelength band of 850 nm to 900 nm, which is used by the IrDA system.

A further object of the present invention is to provide a stable wireless data communication system which does not interfere with conventional systems at a low cost. The present invention can also provide an optical wireless data communication system which can reproduce stable modulated signals under complementary modulation of light with two different wavelengths, as same phase components can be removed through differential detection.

Another object of the present invention is to provide a communication system in which data discrimination is possible without using a PLL circuit, as the data to be transmitted and the clock data have been propagated through the free space by using two types of light with differing polarization states or wavelengths. Another object is to provide an inexpensive optical wireless data communication system by omitting the process of encoding and decoding via special modulation codes, as there is no need for extracting the clock from the received signal. Another object is to provide a transmitter which can be made compact by using a surface-emitting laser which emits two types of light with differing polarization states or wavelengths, and wherein the optical axis is easily adjustable, so that as result, the cost is reduced.

In order to achieve the above objectives, the present invention provides an optical wireless data communication system for performing communication by emitting light of a wavelength of 100 μm or less into free space, including a transmitter having one or more light sources for emitting two or more types of light with mutually differing optical characteristics, said transmitter comprising an emitting means for individually modulating said two or more types of light based on first transmission data obtained by modulating the transmission data and second transmission data obtained by calculating and converting the transmission data, and emitting two or more mutually differing modulated signal light beams, and a receiver having one or more light detecting parts for discriminating and accepting said two or more types of light, said receiver comprising a received data acquiring means for acquiring received data corresponding to said transmission data from the results of the calculation of the modulated signals obtained by accepting said modulated signal light which has propagated along free space.

According to one embodiment of the present invention, the transmission data is used as said first transmission data and a data row of the reversion of the transmission data is used as said second transmission data.

According to another embodiment, the exclusive OR of the divided clock by two and said transmission data is used as said second transmission data.

Another embodiment uses a data row obtained by RZ modulating said transmission data as said first transmission data, and a data row obtained by RZ modulating the reversion of said transmission data as said second transmission data.

A further embodiment uses a combination of linearly polarized light beams with crossing directions as said two or more light beams with mutually differing optical characters.

Another embodiment uses clockwise and counterclockwise circularly polarized light beams as the two or more types of light beams with mutually differing optical characters.

Another embodiment provides a combination of light beams with different wavelengths used as said two or more types of light beams with mutually differing optical characters.

The present invention is characterized in having a transmitter and receiver used for this communication system.

According to the present invention, an inexpensive optical wireless data communication system, and a transmitter and receiver used therefor, have been provided, which is little affected by the disturbing light, which does not affect existing optical wireless communication systems, and which is not affected by existing optical wireless communication systems.

DESCRIPTION OF THE PREFERRED EMBODIMENTS

Now, the embodiments of the present invention will be described with reference to the drawings.

First Embodiment

A first embodiment described below provides a system of optical wireless data communication utilizing two types of light beams with different polarization. Particularly, an example will be explained below for transmitting the transmission data using one polarization state, and transmitting the inverted data row of the transmission data by using another polarization state.

Figure 1:
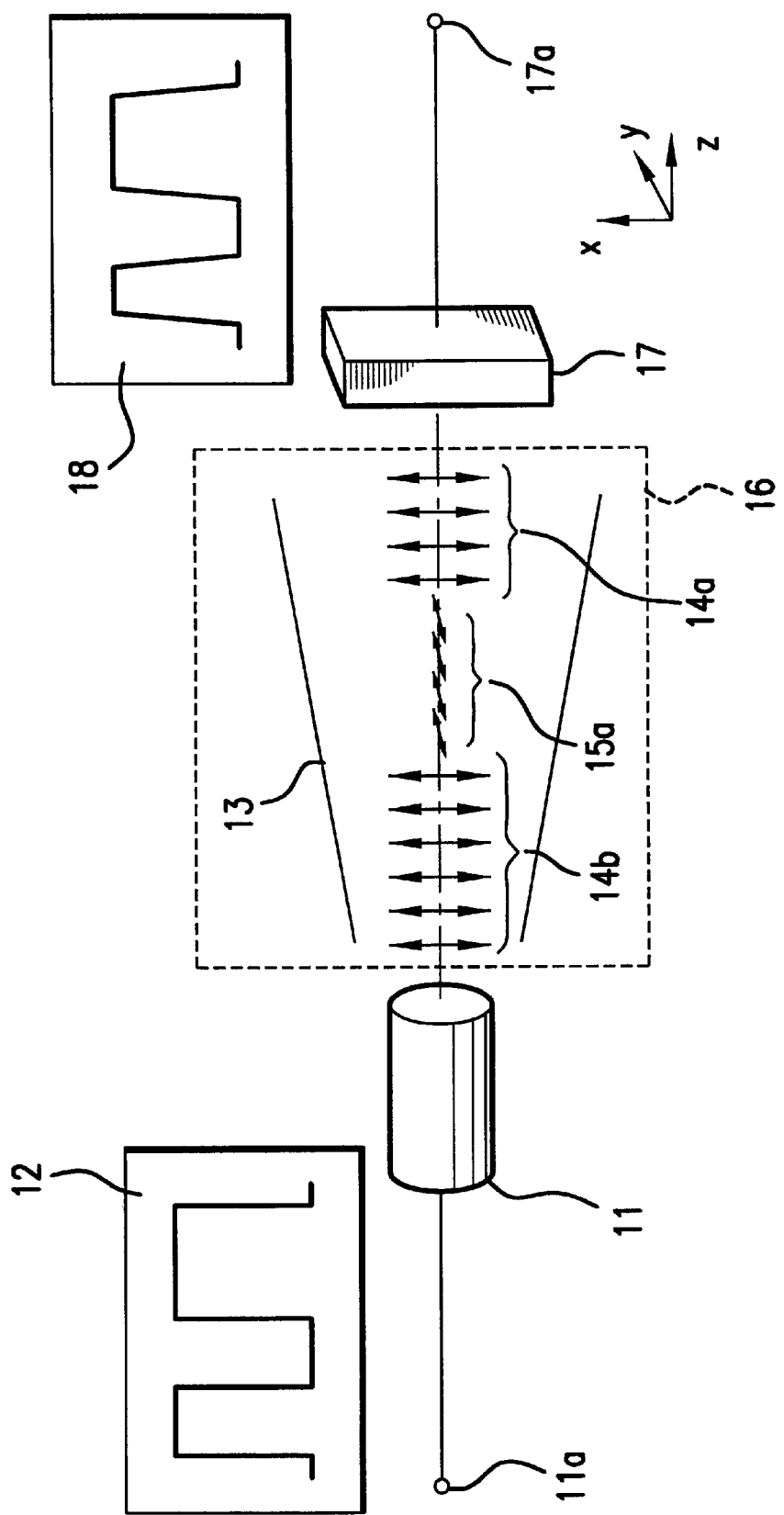
FIG. 1 is an abstract view of the structure of the optical wireless data communication system relating to an embodiment of the present invention.

FIG. 1 shows an example of the wireless data communication system according to the present invention. It shows the structure of transmitting data from a transmitter 11 and receiving such data with a receiver 17. The binary transmission data 12 is input into the input terminal 11a of the transmitter 11. The transmitter 11 emits the electromagnetic wave 13, in which the polarization state has been modulated based on the binary transmission data 12, into a free space 16. The electromagnetic wave 13 travels along the direction of the z-axis. The electromagnetic wave 13 as used herein includes electric waves and light, but the embodiment below will be described mainly with regard to light of 100 $\mu$m or less in wavelength. Furthermore, the free space 16 is not a common waveguide wherein the space is limited by dielectrics or metals, but shall mean a space in which the electromagnetic wave can freely propagate. In reality, in our living space, the ground, walls, ceilings, windows, constructions and human beings are factors which prevent the propagation of electromagnetic waves, but as long as they do not form a specific waveguide, such living space shall also be included in the free space 16.

The electromagnetic wave 13 has a modulated state of polarization. The figure shows a state in which a linearly polarized light beams crossing perpendicularly each other are modulated in correspondence to the binary transmission data. The linearly polarized light beams 14a and 14b are linearly polarized light beams parallel to the x-axis. The linearly polarized light beam 15a is a light beam parallel to the y-axis. As an example, the polarization state is modulated so that the "1" value of the binary transmission data 12 corresponds to a linear polarization parallel to the x-axis, and the "0" value corresponds to a linear polarization parallel to the y-axis. As a result, the binary transmission data 12 will propagate along the free space 16 as changes in the polarization state.

The electromagnetic data 13 reaches the receiver 17. The receiver 17 outputs voltage corresponding to the polarization state at its output terminal 17a. For example, if it receives a linearly polarized light beam parallel to the x-axis, it outputs voltage corresponding to "1," and if it receives a linearly polarized light beam parallel to the y-axis, it outputs voltage corresponding to "0." This in other words is the binary transmission data 18. It is clear from the above descriptions that the contents of this binary transmission data 18 are equal to the contents of the binary transmission data 12. This modulation of the polarization state provides wireless data communication.

Figure 2A:
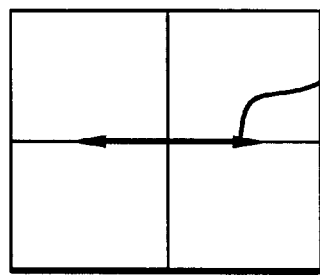
FIG. 2 shows combinations of the polarization states used for the optical wireless data communication system according to the present invention.
Figure 2A:
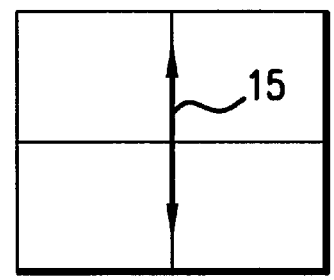
Figure 2B:
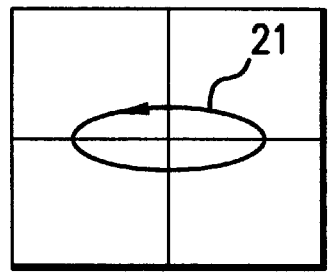
Figure 2B:
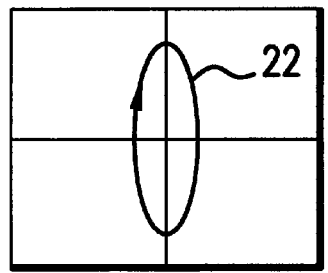

In the example above, a combination of linearly polarized light beams crossing perpendicularly each other was used for modulation of the polarization state. There is a degree of freedom in this combination, and is not limited to linearly polarized light. This will be explained by using FIG. 2. The combination in FIG. 2(a) is made of linearly polarized light beams. The combination of a linearly polarized light beam 14 which is parallel to the x-axis and a linearly polarized light beam 15 which is parallel to the y-axis correspond to the positions "1" and "0" of the binary data. Here, the coordinate axes may be set arbitrarily, and there is no special meaning in making the coordinate axes parallel to the directions of polarization. It only functions to clearly show that the linearly polarized light beams are emitted perpendicularly each other. The combination shown in FIG. 2(b) is a combination of elliptically polarized light beams. With elliptically polarized light beams, a possible combination may be one in which the light beams have equal ellipticity, the major axes have crossing directions, and the rotating directions are opposite. In other words, a possible elliptically polarized light beam pair may have equal absolute values of ellipticity (if the ellipticity includes the rotation directions), and inverse signs. The combinations of these elliptically polarized light beams are at opposite positions on the Poincare sphere. These combinations are sometimes called "independent polarization states." An "independent polarization state" is characterized by enabling conversion into a perpendicular combination of linearly polarized light beams by addition of the same phase difference. The elliptically polarized light beams 21 and 22 shown in FIG. 2(b) are each independent polarization states, and may be utilized for communication by allocating these respectively to "0" or "1" of the binary data.

Figure 2C:
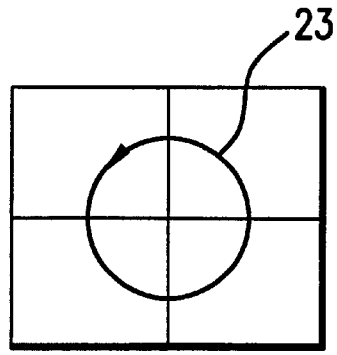
Figure 2C:
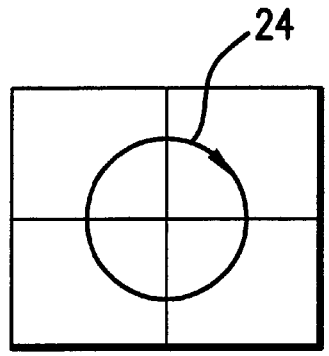
Figure 3:
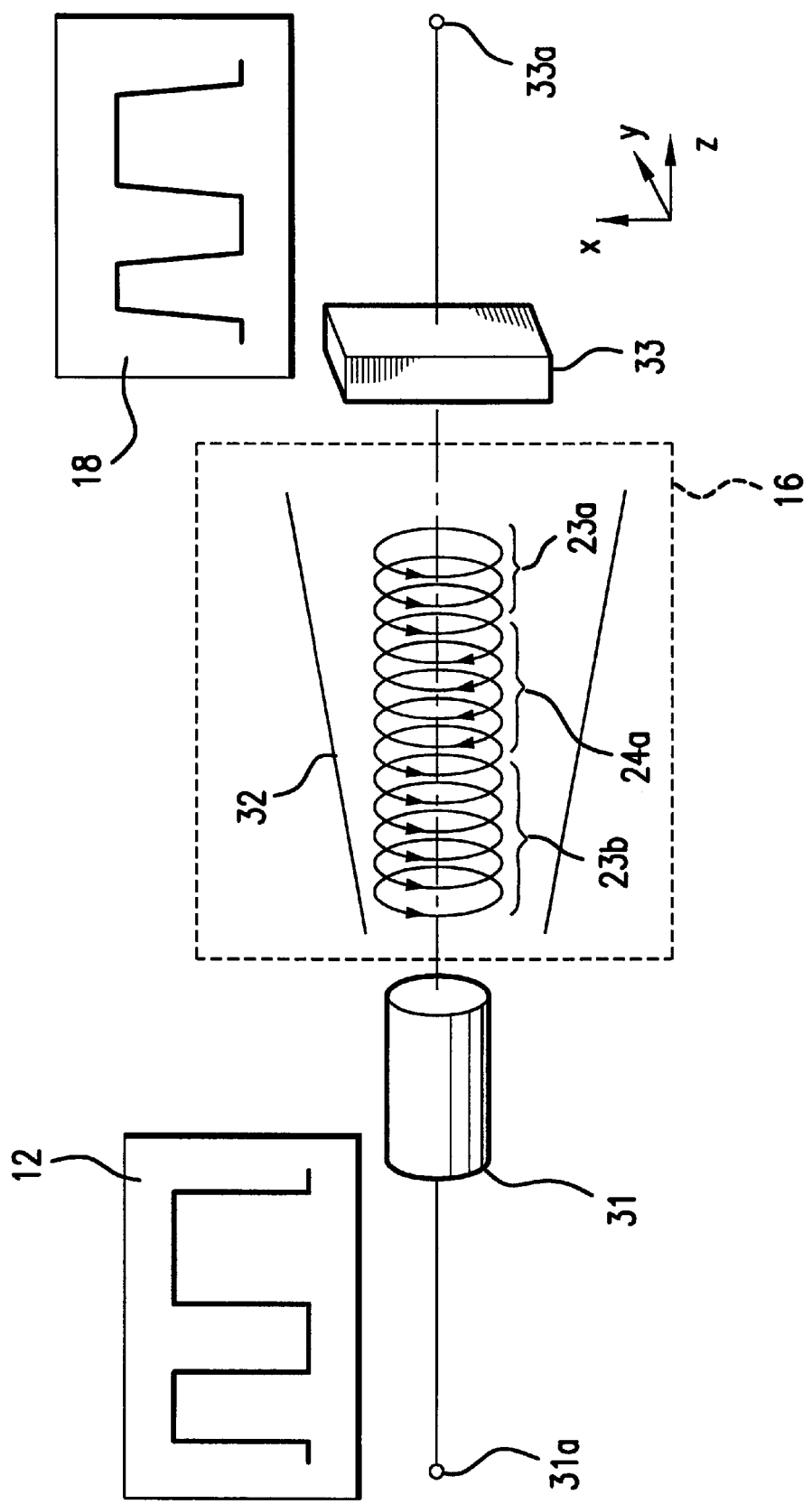
FIG. 3 is an abstract view of the structure of an example of the optical wireless data communication system according to the present invention which utilizes circularly polarized light.

Moreover, particularly useful are combinations where the ellipticity of the elliptically polarized light beams above is ±1, namely combinations of circularly polarized light beams. FIG. 2(c) shows a combination of a counterclockwise circularly polarized light beam 23 and a clockwise circularly polarized light beam 24. This combination is formed of opposite points at the top and bottom poles of the Poincare sphere, and form "independent polarization states." In other words, the counterclockwise circularly polarized light beam 23 and the clockwise circularly polarized light beam 24 correspond to "0" or "1" of the binary data, respectively, to provide a system of communication. This is illustrated in FIG. 3. When the binary transmission data 12 is input into the input terminal 31a of the transmitter 31, the transmitter 31 emits either the counterclockwise circularly polarized light beams 23a or 23b, or the clockwise circularly polarized light beam 24a, in correspondence with "1" or "0" of the binary transmission data 12. The electromagnetic wave 32 which has been modulated in the rotating direction of the circularly polarized light beams above propagates along the free space 16 in the direction of the z-axis to reach a receiver 33. The receiver 33 generates the binary received data 18 by outputting at its output terminal 13a voltage equal to "1" or "0" of the binary data in correspondence with the rotating direction of the circularly polarized light beam. In this way, wireless data communication is also possible by assigning the rotating directions of the circular polarization to correspond to "1" or "0" of the binary data. Further relevant is that it is particularly useful to select the combination of circularly polarized light beams as the "independent polarization states." The reason is that even if the transmitter 31 and the receiver 33 both rotate around the z-axis, the communication state does not depend on this angle of rotation. Circularly polarized light does not have a particular azimuth, so it does not change with the rotation around the z-axis. In case of a linear polarization as shown in FIG. 1, the transmitter 11 and the receiver 17 need to be laid at a particular angle. This requires providing a mechanism for rotating the receiver 17 to the most preferable receiving state at the inside or outside of the receiver. The combination of the circularly polarized light beams shown in FIG. 3 is advantageous in that this mechanism is not necessary.

Figure 4:
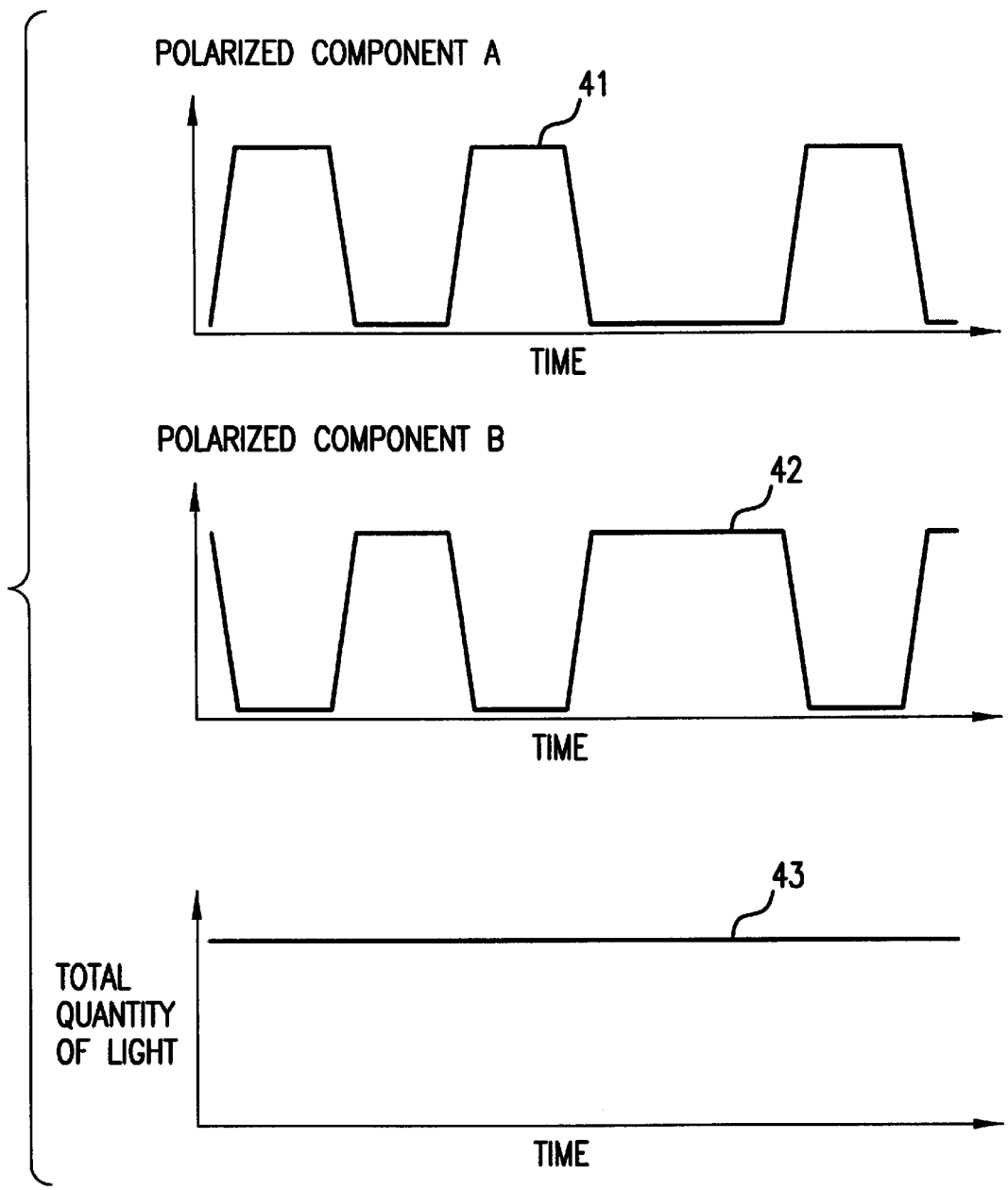
FIG. 4 is a waveform chart showing the time variation in the total quantity of light and the independent polarized light component of an electromagnetic wave emitted from the transmitter of the optical wireless data communication system according to the present invention.

Next, the characteristics of the communication system according to the present invention which utilize a modulation of the polarization will be described below. FIG. 4 shows the time variations of the optical output in the communication using polarized light beam modulation according to the present invention. By assuming the independent polarization states as state A and state B, the optical output from the transmitters 11 and 31 at state A shall be referred as the polarized light component A, and the optical output at state B shall be referred to as the polarized light component B. Based on the binary transmission data 12, the time variation 41 of polarized light component A and the time variation 42 of the polarized light component B of the output electromagnetic wave 13 undergo complementary changes. In other words, if the output of the polarized light component A rises to a high level, the polarized light component B concurrently drops to a low level. The relation between the polarized light components A and B may be called a differential output. If the amplitudes of the polarized light components A and B are equal, it can be seen from FIG. 4 that the total quantity of light 43 obtained by adding these two components becomes a constant, DC light. In other words, when observing only the light intensity and not dividing the light into the electromagnetic waves 13 and 32 output from the transmitters 11 and 31, there is only a DC light, as shown by 43. This is important in that influences to existing optical wireless communication equipment can be ignored. Existing optical wireless communication equipment perform communication by modulating the optical output, so that if two optical wireless communication equipment performs light intensity modulated communication on the same wavelength, both optical outputs will be superimposed, which will become an obstacle in the communication. However, as the optical wireless data communication system according to the present invention only outputs unchanging DC light as the optical output, the electromagnetic waves 13 and 32 output from the transmitters 11 and 31 according to the present invention will reach and give a very small influences to the receivers of existing optical wireless communication devices. DC light which enters the receiver of an existing optical wireless communication device will offset all of the received light, but such offset can be easily removed during the reproduction of the data. In this way, electromagnetic waves output under the optical wireless data communication system according to the present invention will not affect existing optical wireless data communication equipment.

Furthermore, the optical wireless data communication system according to the present invention is characterized by being little influenced by electromagnetic waves output from the transmitters of existing optical wireless data communication equipment. This will be explained by using the time variations of the polarized light components in FIG. 5. Assuming that the polarized light component A modulated like the waveform 51, and the polarized light component B modulated like the waveform 54 enter the receiving window of the receivers 17 and 33 used for the optical wireless data communication system according to the present invention. In reality, illuminations and electromagnetic waves output from the transmitters of existing optical wireless data communication equipment enter the receiver. These influences shall be called disturbing light. Here, the disturbing light is unpolarized light, and shall not be modulated with a particular polarized light component, nor change. In fact, existing optical wireless data communication equipment use unpolarized light, and many light sources such as illuminations output unpolarized light, so these premises are practical. The disturbing light can then be divided in an disturbing light A component 52 and an disturbing light B component 55, which both have the same intensity. As shown by the waves 52 and 55, the disturbing light changes with time. The components A and B, which are the intensity of the electromagnetic waves on the receiver, become waveforms 53 and 56 by adding 51 and 52, and 54 and 55, respectively. As the disturbing light also changes with time, the waveforms 53 and 56 change in a very complex manner. However, as the receivers 17 and 33 will detect only the component wherein the polarization state is modulated as the signal component, it can reproduce the signal obtained by subtracting the waveform 56 from the waveform 53, namely the modulated polarized light component 57. In this way, even if unpolarized disturbing light enters under the optical wireless data communication system according to the present invention, such light can be cancelled as common phase components, so that such disturbing light will have little effect. In other words, even if the source of disturbing light is the transmitter of an existing optical wireless data communication device, the optical wireless data communication system according to the present invention will be able to conduct communication without being affected thereby.

Concluding from the above, the optical wireless data communication system according to the present invention will little affect, and little be affected by, existing optical wireless data communication equipment, so that a concurrent use is possible even when the same wavelength. For example, with the existing optical wireless data communication system IrDA, the peak wavelength of the communication light is prescribed to be within the range from 850 nm to 900 nm. When using the optical wireless data communication system according to the present invention, wireless data communication will be possible which does not interfere with the IrDA system when using the same wavelength range of 850 nm to 900 nm. This wavelength band is a range in which GaAs or AlGaAs semiconductor lasers can be used as the light source of the transmitter, and PIN photodiodes made of silicon can be used as the light detecting element of the receiver. These materials are most advantageous for providing an inexpensive communication device. In other words, the optical wireless data communication system according to the present invention can provide optical wireless data communication which does not interfere with existing optical wireless data communication equipment and which uses the most cost-effective wavelength band.

Figure 5:
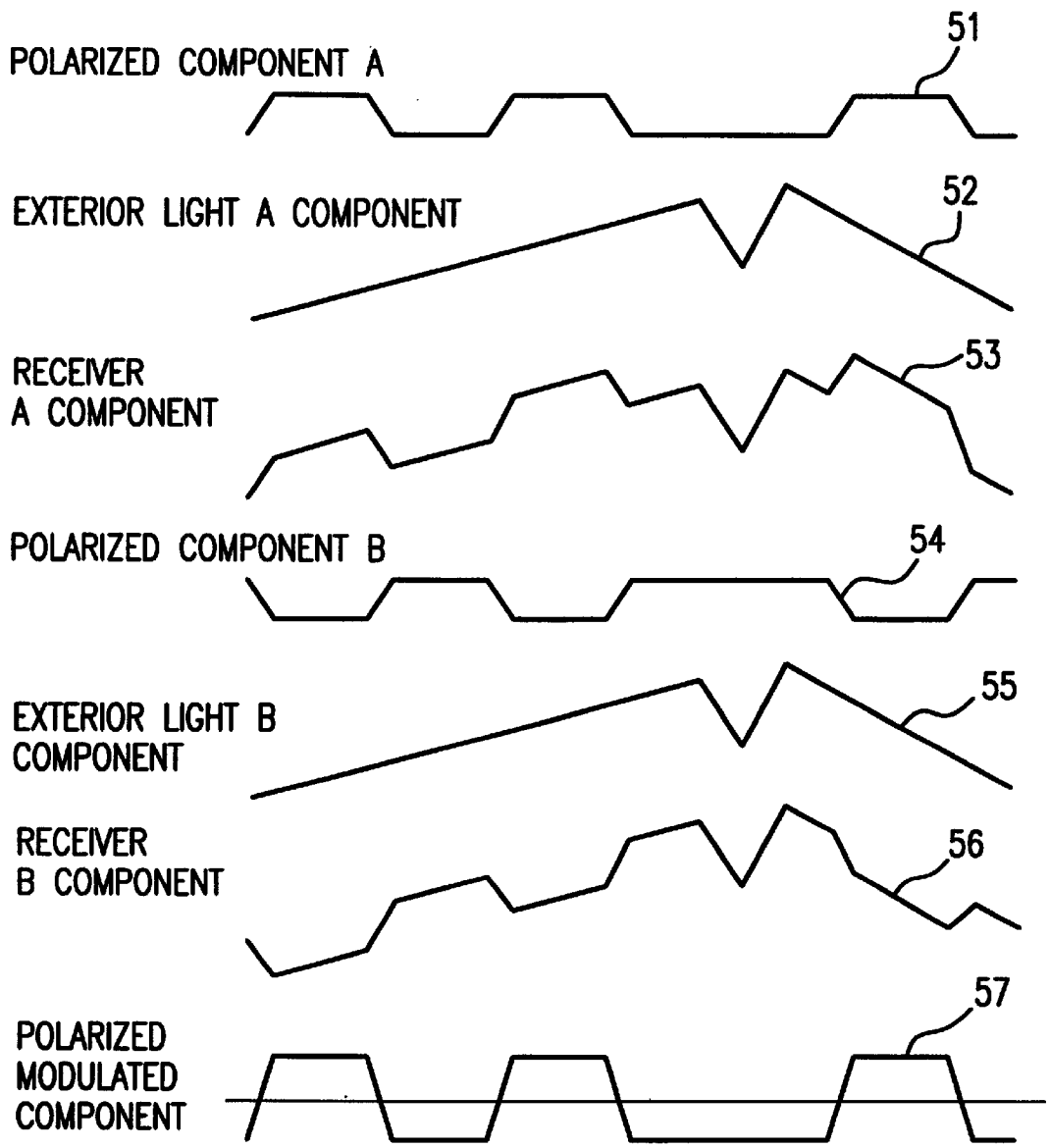
FIG. 5 is a waveform chart showing the time variation after adding influence of disturbing light to the independent polarized light component of an electromagnetic wave emitted from the transmitter of the optical wireless data communication system according to the present invention.

As explained with FIG. 5, the optical wireless data communication system according to the present invention can provide stable received signals regardless of disturbing light entering the receiver, as the influences of such light can be removed. The free space 16 is full of light which has far larger intensity than the electromagnetic waves used for communication due to sunlight, glow lamps and fluorescent lamps. However, as all of these types of light are unpolarized, the optical wireless data communications system according to the present invention can remove the effects of this unpolarized light effectively. Therefore, it is able to extract communication light buried among these strong disturbing light, and the signal has a high SN ratio.

As the optical wireless data communication system of the present invention emit the DC light in stead of AC light from the transmitter, the average output obtained is approximately twice that of conventional light communication which has been modulated in intensity. As a result, the number of photons per pulse can be increased to twice the number, thereby increasing the SN ratio by approximately 3 dB.

Next, the transmitter used for the optical wireless data communication system according to the present invention will be described in detail.

Figure 6:
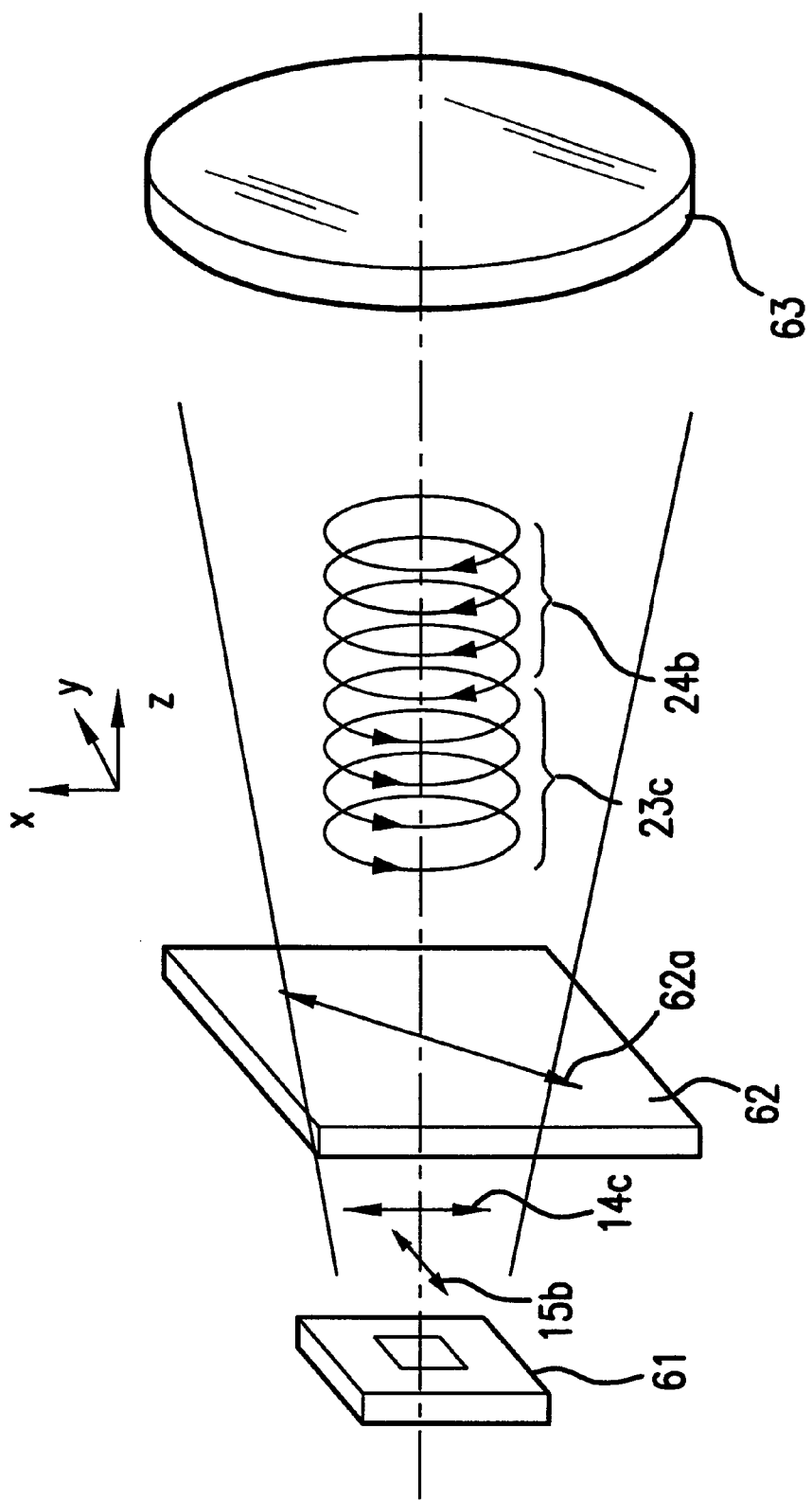
FIG. 6 is an abstract view of the structure of one example of the transmitter used for the optical wireless data communication system according to the present invention.

FIG. 6 shows an example of the transmitter according to the present invention. It shows a transmitter 31 used for counterclockwise and clockwise circularly polarized light. The modulated linearly polarized light-emitting element 61 is an element which, in correspondence with the input, can output linearly polarized light beams 14c and 15b crossing perpendicular directions. If this linearly polarized light itself is emitted into the free space 16, it will be a transmitter 11 for linearly polarized light. When using a set of counter-clockwise and clockwise circularly polarized light beams, a quarter-wave plate 62 is used for converting the linearly polarized light beams into circularly polarized light beams 24b and 23c. If the quarter-wave plate 62 is arranged so that its optical axis 62a is inclined by an angle of 45 degrees against the linearly polarized light beams 14c and 15b, it is possible to convert linearly polarized light into circularly polarized light. In this process, the relation between the azimuth of the linearly polarized light and the rotating direction of the circularly polarized light differ depending on whether the optical axis 62a is slow or fast. Assuming the linearly polarized light beam 14c which is parallel to the x-axis is to be converted into a clockwise circularly polarized light beam 24b, then the linearly polarized light beam 15b which is parallel to the y-axis will be converted into a counterclockwise circularly polarized light beam 23c.

As the circularly polarized light beams 24b, 23c with modulated directions of rotation have been generated as above, they may be emitted are into the free space 16, but in many cases, it is effective to adjust the angle of dispersion of the light by passing it through a lens system 63.

Now, the modulated linearly polarized light-emitting element 61 will be described in detail. A light-emitting element which can modulate its optical output is generally known, but elements which can modulate its polarization state is not so generally known. However, such kind of modulated polarized light-emitting element can be realized with a single element or a combination of a plurality of elements. For example, when combining a plurality of elements, it is possible to modulate the direction of the plane of polarization of the light emitted from a laser light source by using an optically rotating element which utilizes a nematic liquid crystal. However, in this case, there is the disadvantage that the speed of response of the liquid crystal is not fast enough to be used for communication. As a single element, a semiconductor laser may be used. Normal semiconductor lasers emit a linearly polarized light beam with a fixed plane of polarization, but by designing the structure. it is possible to modulate the plane of polarization. As an example, a vertical cavity surface-emitting semiconductor laser will be described below.

Figure 7:
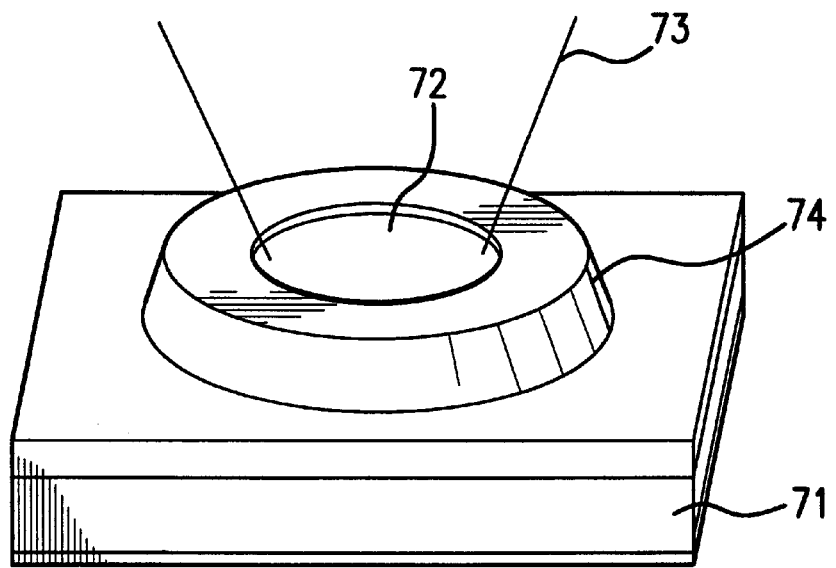
FIG. 7 is a perspective, schematic view of a vertical cavity surface-emitting semiconductor laser used for the transmitter according to the present invention.
Figure 8:
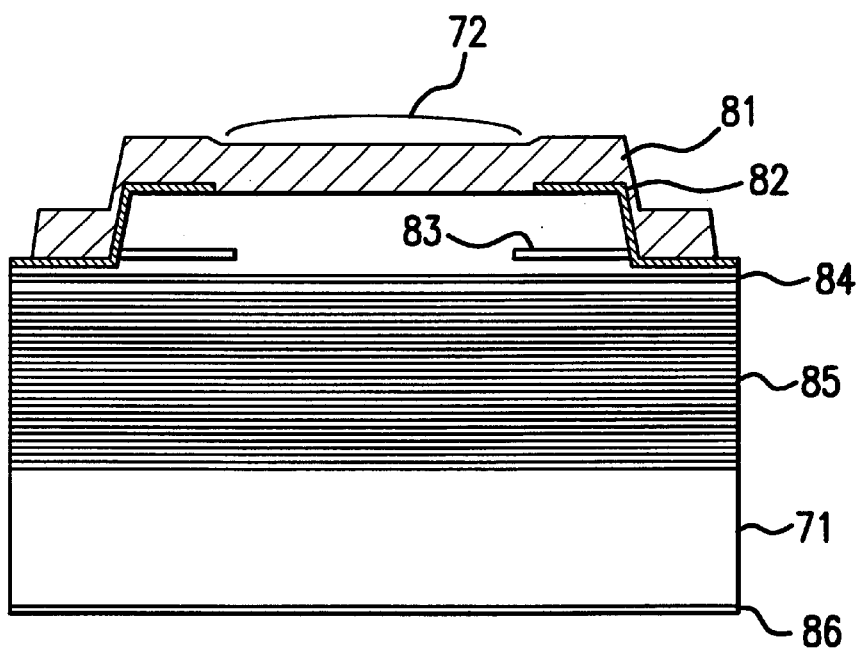
FIG. 8 is a cross sectional, schematic view of a vertical cavity surface-emitting semiconductor laser used for the transmitter according to the present invention.

FIG. 7 shows an exterior view of a vertical cavity surface-emitting semiconductor laser (hereinafter called surface-emitting laser). A surface-emitting laser is characterized by a laser beam 73 being emitted vertically to the surface of a substrate 71 from an aperture 72. The surface-emitting laser is made by forming a semiconductor layer on the substrate 71 through the epitaxial technique, and processing this layer through the photolithography technique. A cross section of this surface-emitting laser is shown in FIG. 8. When carriers of electrons or positive holes are injected from a bottom electrode 86 and a top electrode 82, these carriers continue to diffuse to reach an activated layer 84. An even more desirable structure is that the carriers injected from the top electrode 82 are squeezed via a layer for squeezing the width of the current path 83, and then collected at the activated layer 84 in a center are directly under the aperture 72. The electrons and positive holes reaching the activated layer 84 are recombined and emit light. This light reciprocates inside the resonator formed by a bottom semiconductor mirror 85 and a top mirror 81. When the reciprocating light passes the activated layer 84, it is amplified by inducing a stimulated emission, and light with large intensity is bound inside the resonator. A portion thereof passes through the top mirror 81 and is emitted to the exterior as the laser beam 73.

Figure 9:
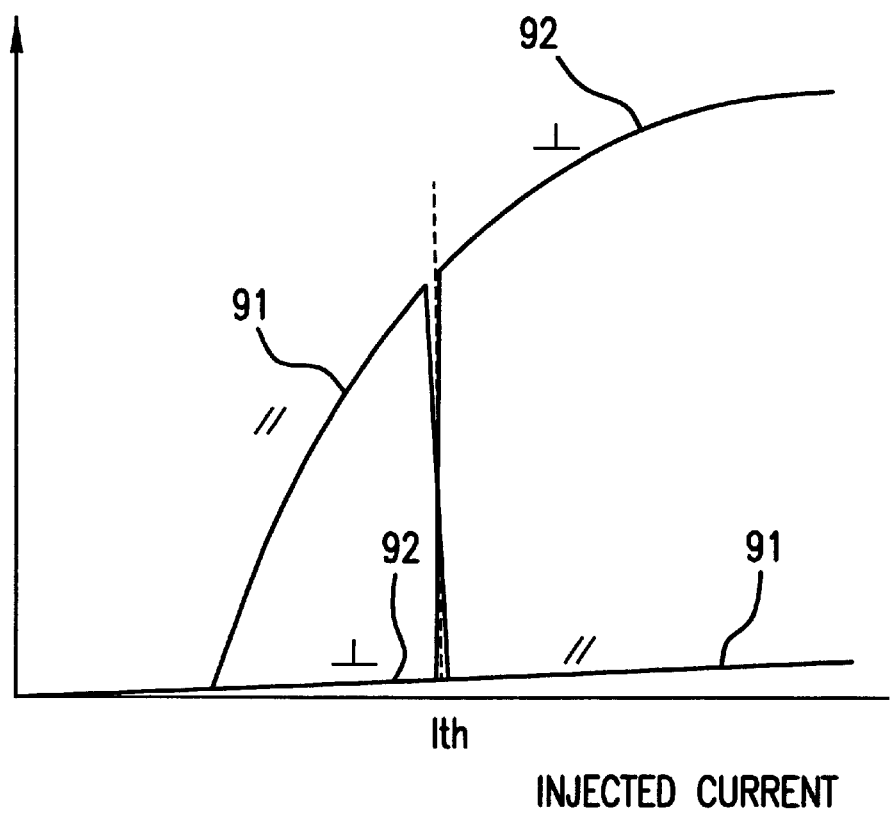
FIG. 9 is a view showing the dependence of the optical output, which has a certain direction of polarization, on the injected current, which is characteristic to the vertical cavity surface-emitting semiconductor laser used for the transmitter according to the present invention.

A surface-emitting laser operates in the way described above, but as it is also clear from FIG. 7, the shape of the resonator 74 can be designed freely through photolithography processing, so controlling the polarized light is made possible. For example, by making the cross section of the resonator 74 the shape of a circle, the azimuth is not specified, so there is a large degree of freedom in the plane of polarization of the laser beam 73. Therefore, by changing the injected current as shown in FIG. 9, it is possible to switch the plane of polarization. FIG. 9 shows the relation of dependency between a polarized light component 91 in the parallel direction (parallel shall mean any convenient direction) and a polarized light component 92 in the vertical direction (vertical to the parallel direction), and the injected current. If the injected current is less than Ith, mainly linearly polarized light in the parallel direction is emitted, but if the injected current exceeds Ith, it is clear that the emission switches to the linearly polarized light in the vertical direction. In other word, by modulating the injected current in the vicinity of Ith, it is possible to modulate the plane of polarization of the linearly polarized light. The description above relates to an example of modulating the injected current, but it is also possible to apply electric or magnetic fields, causing strain. injecting polarized light, etc., to modulate the plane of polarization. The use of these surface-emitting lasers as the modulated linearly polarized light-emitting element 61 can realize a transmitter according to the present invention.

Figure 10A:
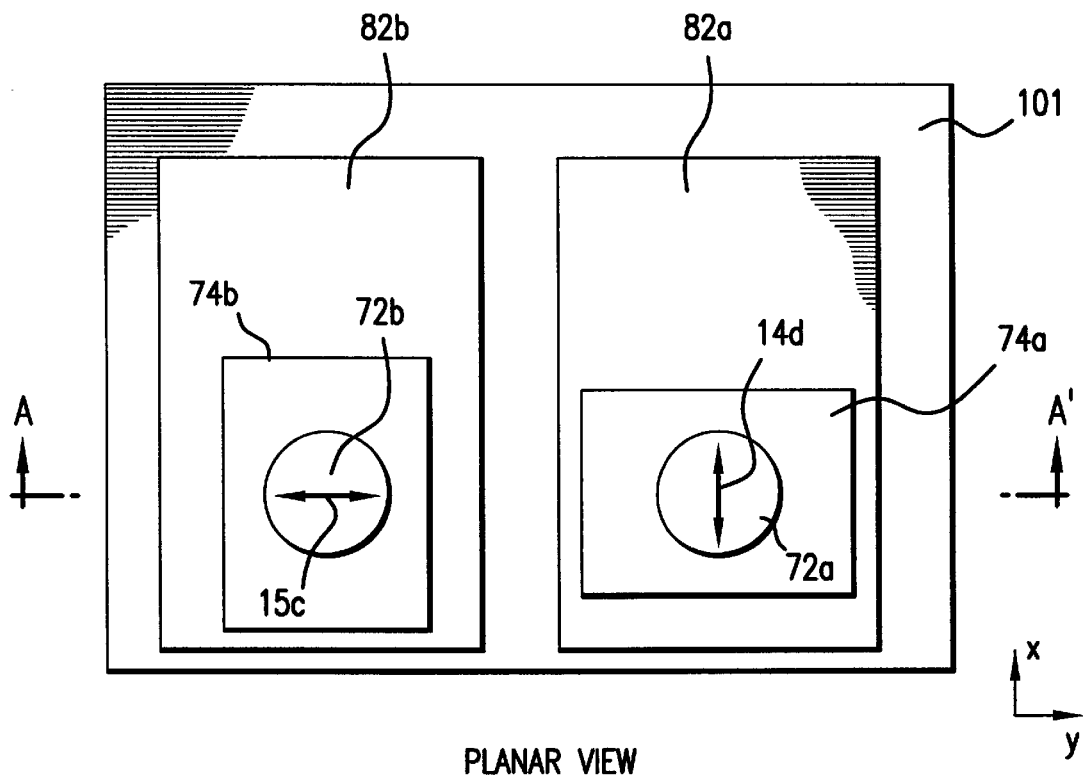
FIG. 10 is a planar view and a cross sectional view showing another example of a vertical cavity surface-emitting semiconductor laser used for the transmitter according to the present invention.
Figure 10B:
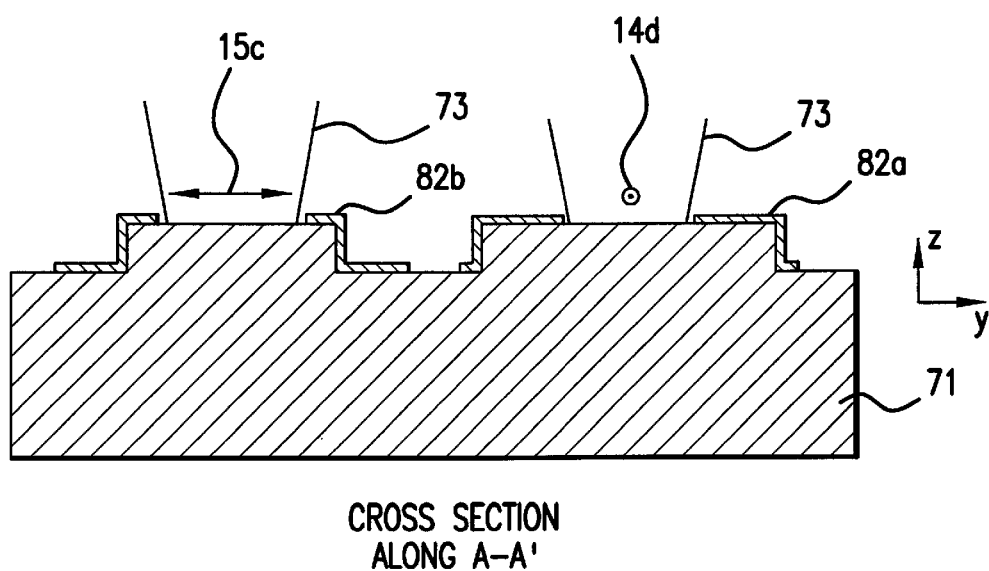

It is also possible to use a surface-emitting laser wherein there is no switching of the polarization plane, namely wherein the polarization plane is fixed, a the modulated linearly polarized light-emitting element 61. This can be realized by providing a surface-emitting laser which emits different polarized light beams on the same substrate, as shown in FIG. 10. By forming the resonators 74a and 74b with rectangular cross sections as shown in FIG. 10, it is possible to control the plane of polarization to fix in one fixed direction. When the resonators 74a and 74b are formed rectangular, the plane of polarization becomes fixed in a direction parallel to the short side of the rectangle, by forming a rectangular resonator 74a with its short side parallel to the x-axis and a rectangular resonator 74b with its short side parallel to the y-axis neighboring each other on one same substrate 71, a linearly polarized light beam 14d parallel to the x-axis and a linearly polarized light beam 15c parallel to the y-axis, respectively, can be obtained. This structure does not provide a modulation and emission of linearly polarized light beams perpendicularly polarized each other from a single aperture, but the emission of linearly polarized light beams perpendicularly polarized each other from very closely placed apertures 72a and 72b, respectively. When a linearly polarized light beam parallel to the x-axis is to be emitted, current is injected from the top electrode 82a, and when a linearly polarized light beam parallel to the y-axis is to be emitted, current is injected from the top electrode 82b. In order to operate this multiple aperture type surface-emitting laser 101 as the modulated linearly polarized light-emitting element 61, it is practical to use the circuits shown in FIG. 11.

Figure 11:
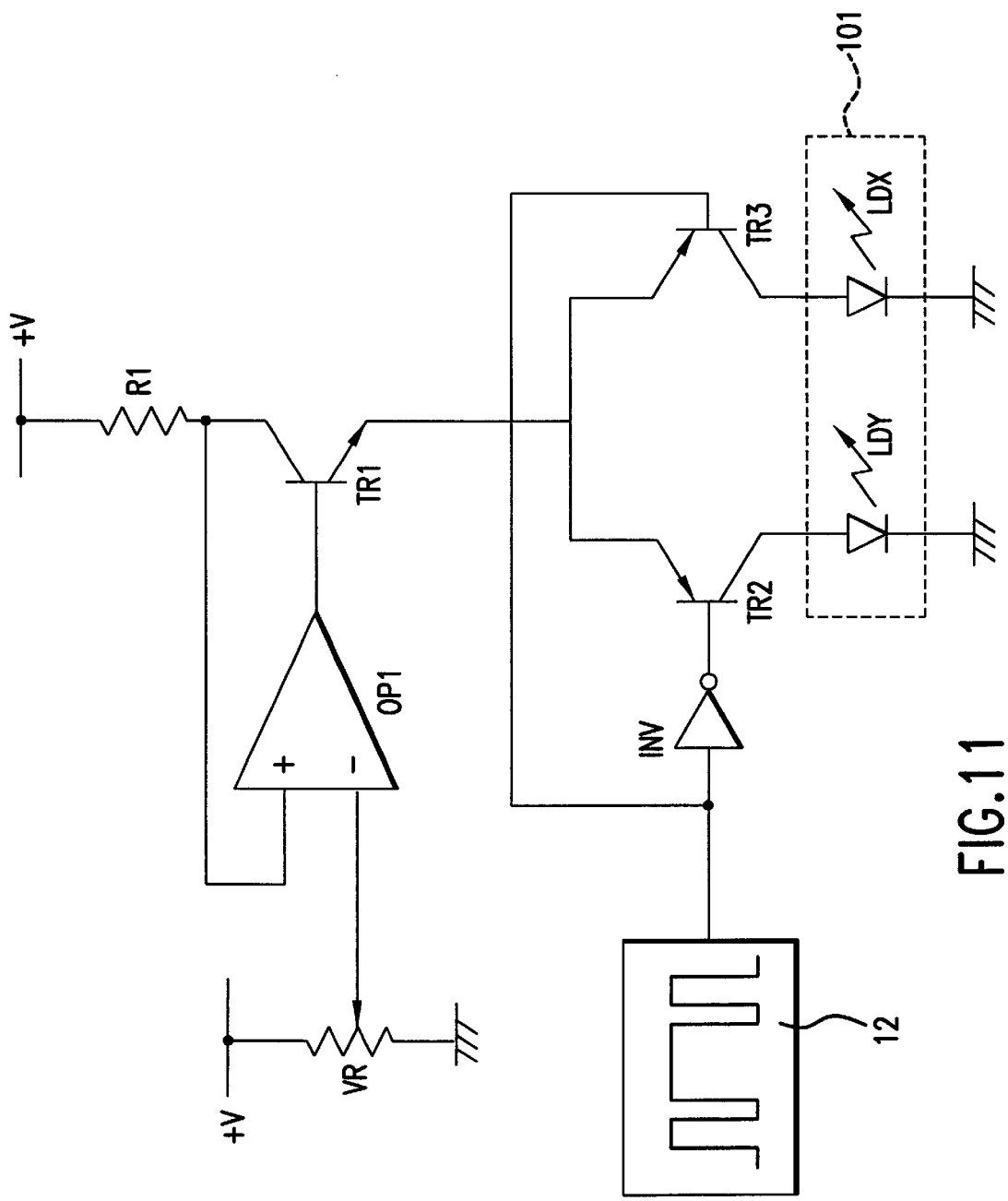
FIG. 11 is a circuit diagram showing one exemplary circuit structure for driving the vertical cavity surface-emitting semiconductor laser in FIG. 10.
Figure 12:
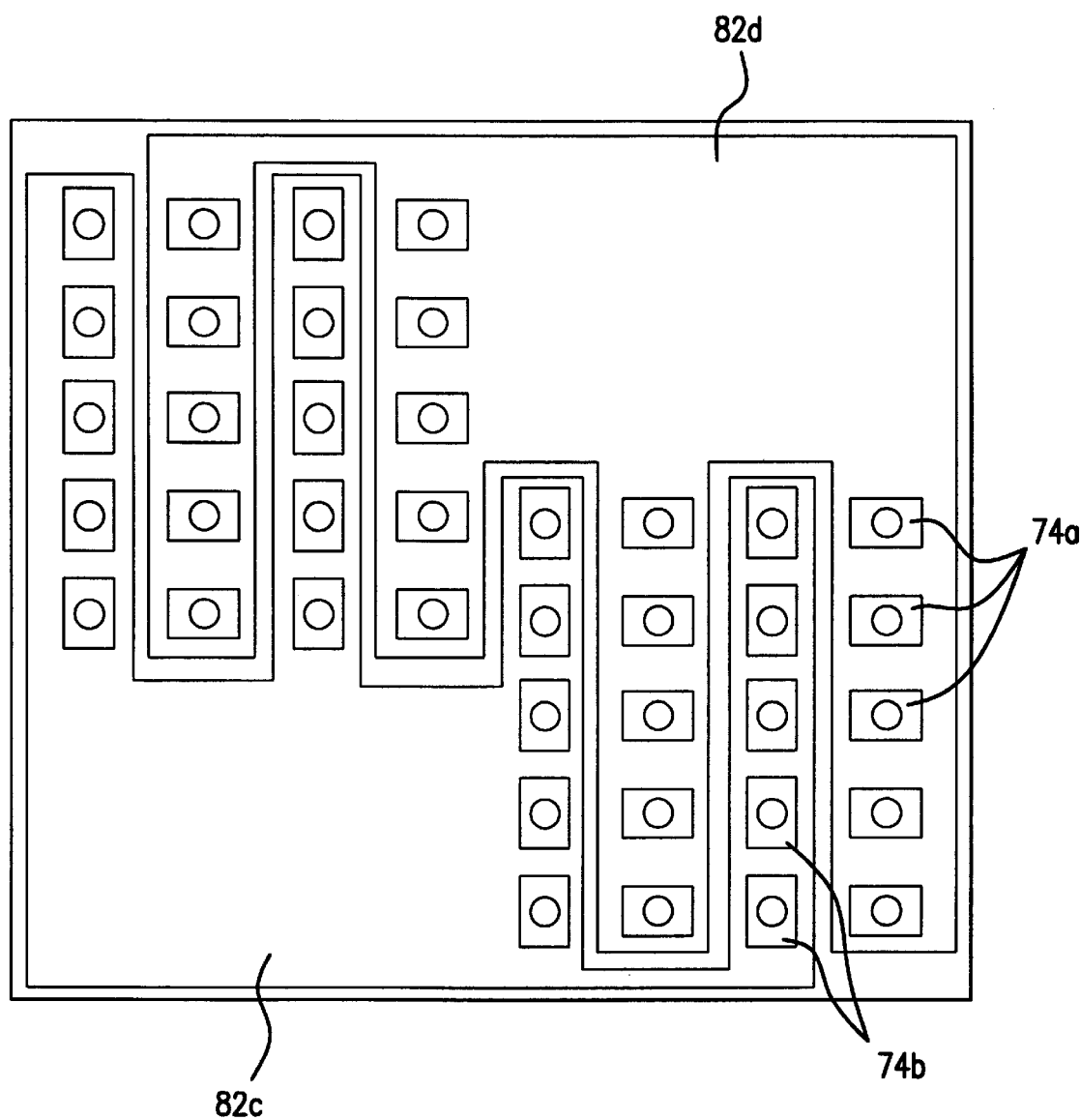
FIG. 12 is a planar view showing a light source structure wherein a large number of the vertical cavity surface-emitting semiconductor lasers in FIG. 10 have been arranged on the same chip.

In FIG. 11, OP1, TR1, and R1 form a constant current source for supplying the current corresponding to the voltage set by VR from the emitter of TR1. When one terminal (minus terminal) of OP1 is set to V1, by TR1 supplies a current Ie=(V−V1)/R1. TR2 and TR3 are switching transistors, and function to switch the current Ie to either surface-emitting lasers LDX or LDY. The bases of TR2 and TR3 are driven by the binary transmission data 12 or the inverted signals passing through an inverter INV. In other words, TR2 and TR3 are complimentarily switched to their on/off states, and operate so that when one is in an on state, the other is in an off state. This leads to current Ie flowing in only either one of the lasers LDX and LDY. These lasers LDX and LDY are the multiple aperture type surface-emitting lasers 101 formed on the same substrate 71. Assuming LDX is the surface-emitting laser which emits linearly polarized light parallel to the x-axis and LDY is the surface-emitting laser which emits linearly polarized light parallel to the y-axis, the multiple aperture type surface-emitting laser 101 will emit linearly polarized light parallel to the x-axis if the binary transmission data 12 is "1," and linearly polarized light parallel to the y-axis when "0." The transmitter according to the present invention can be realized by utilizing this kind of multiple aperture type surface-emitting laser 101 as the modulated linearly polarized light-emitting element 61 driven by the circuit shown in FIG. 11. This type of circuit structure in which TR1 provides a constant current and TR2 and TR3 change the path of this current is characterized in that is can perform high-speed modulations.

As shown in FIG. 10, surface-emitting lasers in which the plane of polarization is fixed can be manufactured en masse via the photolithography technique. The direction of polarization could be controlled to be fixed effectively by designing the laser so that the long side is at least 1.2 times the length of the short side of the rectangle. When the length of the long side was set to a least 1.4 times the length of the short side, the control could be secured at an even higher rate. As the surface-emitting laser is principally able to conduct modulation up to at least 1 GHz, the system shown in FIG. 10 guarantees a modulation of the plane of polarization up to 1 GHz. As the circuit structure shown in FIG. 11 is suited for high-speed modulation, high-speed and large-capacity optical wireless data communication can be realized by utilizing the above-described multiple aperture type surface-emitting laser 101 as the modulated linearly polarized light-emitting element 61.

Operation is possible when the diameter of the aperture of the surface-emitting laser is set within a range of 1μm to 100 μm, and the distances between the apertures of the multiple aperture type surface-emitting laser 101 may be within the range of 2 μm to 400 μm. As the distance between the apertures are very small compared to the total size of the transmitter or the size of the free space 16, it is the same as if the light were emitted from one single aperture. If the optical output of each one of the surface-emitting lasers is too small to provide optical wireless data communication it is possible to form a large number of surface-emitting lasers 74a or 74b which emit linearly polarized light having the same direction of polarization on the same substrate to improve the output. This emission of communication light from a plurality of surface-emitting lasers not only increases the optical output as largely as possible but also has the effect of enhancing safety to the naked eye. When a laser beam is emitted from a single aperture, and a portion of this laser beam enters the naked eye, it is possible that the entering energy will be focused in one point of the retina due to the lens function of the naked eye. Laser light focuses in one point has a great energy density, which will sometimes damage the retina. On the other hand, when laser light emitted from a plurality of apertures enters the naked eye, the energy density is low even if the same energy as above has reached the retina, because this laser light is not focused in one point. Therefore, when considering that the output is the same, it can be said that the laser light emitted from a plurality of apertures is safer.

The transmitter example above explains mainly the use of a surface-emitting laser, but other light-emitting elements may be used too. Conventional edge-emitting semiconductor lasers output polarized light (TE waves) parallel to the activated layer, but it is possible to manufacture a semiconductor laser which can increase the gain of the TM waves and switch between TE waves and TM waves by utilizing a strained superlattice structure. The transmitter may be structured by using this improved edge-emitting laser as the modulated linearly polarized light-emitting element 61. By perpendicularly crossing their directions of polarization and mounting conventional edge-emitting semiconductor lasers which can only output TE waves, it is possible to manufacture an element which can seemingly output two types of polarized planes, so it is possible to manufacture the transmitter by using this structure. However, mounting edge-emitting semiconductor lasers which have perpendicularly crossing directions of polarization require an adjustment of the alignment of the optical axes and the angle of dispersion, so the cost, which does not become lower than with surface-emitting lasers, is a problem.

Next, an example of the receivers 17 and 33 will be described. Assuming the electromagnetic wave 32 with modulated, circularly polarized direction of rotation is to be received. The electromagnetic wave 32 which has propagated along the free space 16 is collected through a lens-filter system 131. As electromagnetic waves of wavelengths other than those used for communication cause disturbance, they are desirably removed through reflection or absorption by the lens-filter system 131 from the passed light. The circularly polarized light beams 23d and 24c which have passed through the lens-filter system 131 are converted into linearly polarized light through a quarter-wave plate 132. This is the reverse operation of the conversion of linearly polarized light to circularly polarized light as described with the transmitter. For example, the counterclockwise circularly polarized light beam 23d is converted into linearly polarized light parallel to the x-axis, and the clockwise circularly polarized light beam is converted into linearly polarized light parallel to the y-axis. At this time, it is possible to set the x-axis and the y-axis to the azimuth of 45 degrees to the optical axis 132a of the quarter-wave plate 132. The analyzer 133 is arranged to pass, reflect or absorb polarized light components which are parallel or vertical to such x-axis or y-axis. The illustrated example shows one case in which a polarized beam splitter is used as the analyzer 133. The polarized beam splitter 133 is arranged to reflect polarized light components parallel to the x-axis, and pass polarized light components parallel to the y-axis. Accordingly, light which as been converted into linearly polarized light parallel to the x-axis will be guided to a photodetector 134a. On the other hand, linearly polarized light parallel to the y-axis will be guided to a photodetector 134b. The photodetectors generate current in correspondence with the light intensity entering the photodetector. Current waveforms corresponding to 53 and 56 in FIG. 5 will be obtained from photodetectors 134a and 134b.

Figure 14:
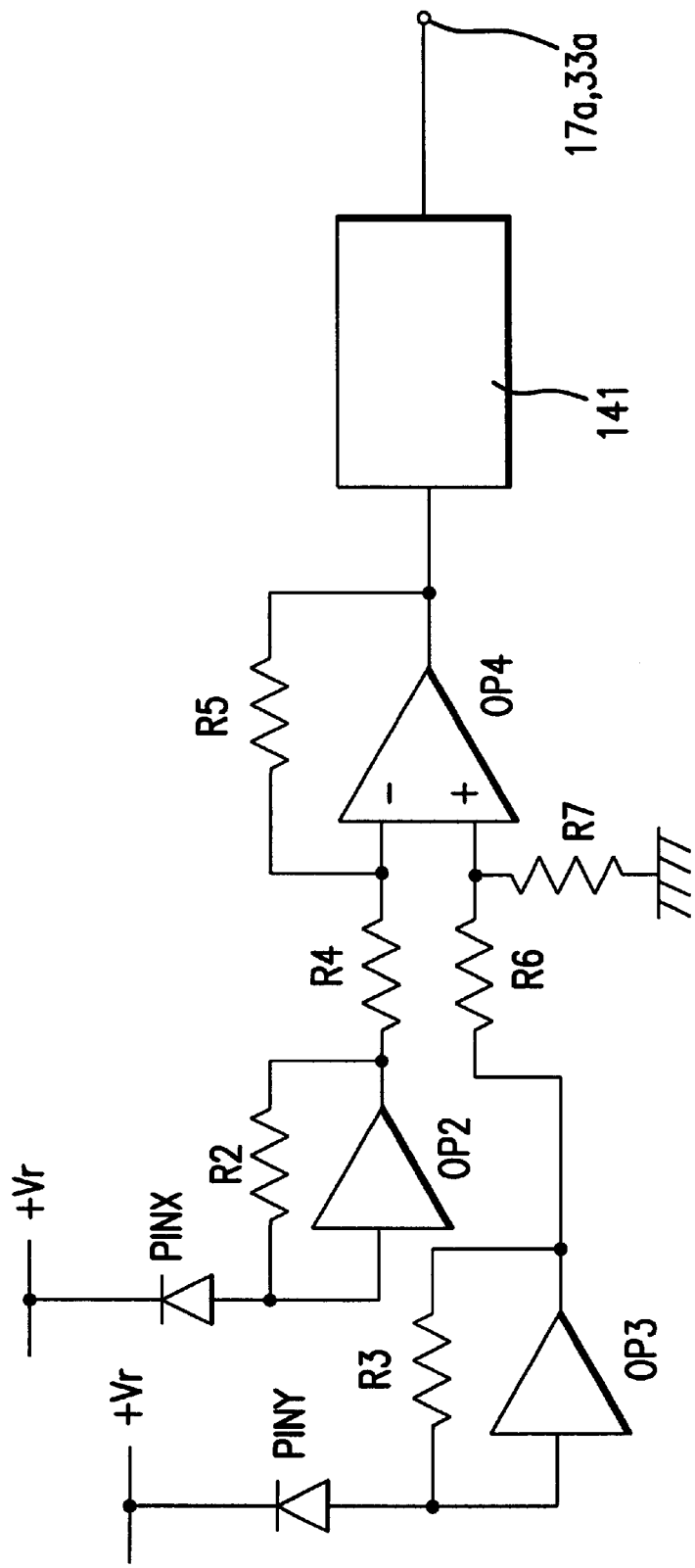
FIG. 14 is a circuit diagram showing one exemplary circuit for operating the receiver in FIG. 13.

The circuit shown in FIG. 14 will be used for obtaining a modulated polarized light component of the waveform corresponding to the binary data in 57 from the waveforms 53 and 56 in FIG. 5. Here, a PIN photodiode has been used as the photodetectors 134a and 134b. PINX and PINY correspond to the photodetectors 134a and 134b. A reverse bias voltage Vr is applied to the PIN photodiodes PINX and PINY. A current Is corresponding to the optical output flows from the anodes of the PIN photodiodes PINX and PINY, and then to the current-voltage conversion circuit formed by OP2 and R2, and OP3 and R3. These current-voltage conversion circuits convert Is to the voltages Is·R2, and Is·R3, respectively. Normally, it is desirable to set R2=R3. After their conversion into voltage signals, the two signals are input into a differential amplifier formed by OP4, R4, R5, R6, and R7, the differential components are amplified, and the common phase components are removed. Normally, it is designed so that R4=R6 and R5=R7 to obtain the amplification rate R5/R4. A waveform 57 equal to the modulated polarized light component can be obtained thereby. At this stage, the signal is an analog signal, so for the conversion into the binary received signal, it is inputted into a data discriminator 141 and converted into binary data, thereby obtaining the binary received data 18 is output terminals 17a and 33a.

In this way, it is possible to receive the electromagnetic wave 32 with modulated direction of rotation of the circularly polarized light, and demodulate the binary data. When receiving the electromagnetic wave 13 with a modulated plane of polarization of the linearly polarized light, there is no need for converting circularly polarized light to linearly polarized light, so receiving is possible by removing the quarter-waver plate 132 from the structure in FIG. 13. Regarding the other elements and circuits, receiving is possible through the same principle as with the circularly polarized light above.

The photodetectors 143a and 134b of the receiver above have been explained by using PIN photodiodes, but it is also possible to use other optical energy conversion elements. When using semiconductors, it is advantageous to use avalanche photodiodes regarding the sensitivity and the speed. It is also possible to use optical transistors which control carriers through light. With semiconductors, it is possible to provide an inexpensive receiver if the wavelength is 1 $\mu$m or less, as silicon can be used. As described above, the optical, wireless data communication system according to the present invention will cause no interference with conventional optical wireless communication systems in using wavelengths from 850 nm to 900 nm, so this wavelength band can be used. Among elements other than semiconductors, it is possible to use photoelectric amplifier tubes. The above examples have explained the analyzer with the polarized beam splitter 133, but there is no problem in using various types of polarization elements. It is possible to use birefringent polarizors such as a Glan-Taylor polarization prism, a Glan-Thompson polarization prism, a Wollaston prism, and a Thompson prism, a dichroic resin film, a metal whisker film, or a multilayered refractive resin film.

Second Embodiment

A second embodiment explained below provides an optical wireless data communication system using two types of light with differing polarization states. The difference to the first embodiment is that two types of polarized light with differing polarization states are used for transmitting the transmission data and the clock data.

The two polarization states used here are "independent polarization states" as described with the first embodiment which are positioned at opposite points on the Poincare sphere, Special combinations are a combination of crossing linear directions, or a combination of counterclockwise and clockwise circularly polarized light. These combinations of polarization states shall be referred to as combinations of a first polarization state and a second polarization state.

Figure 15:
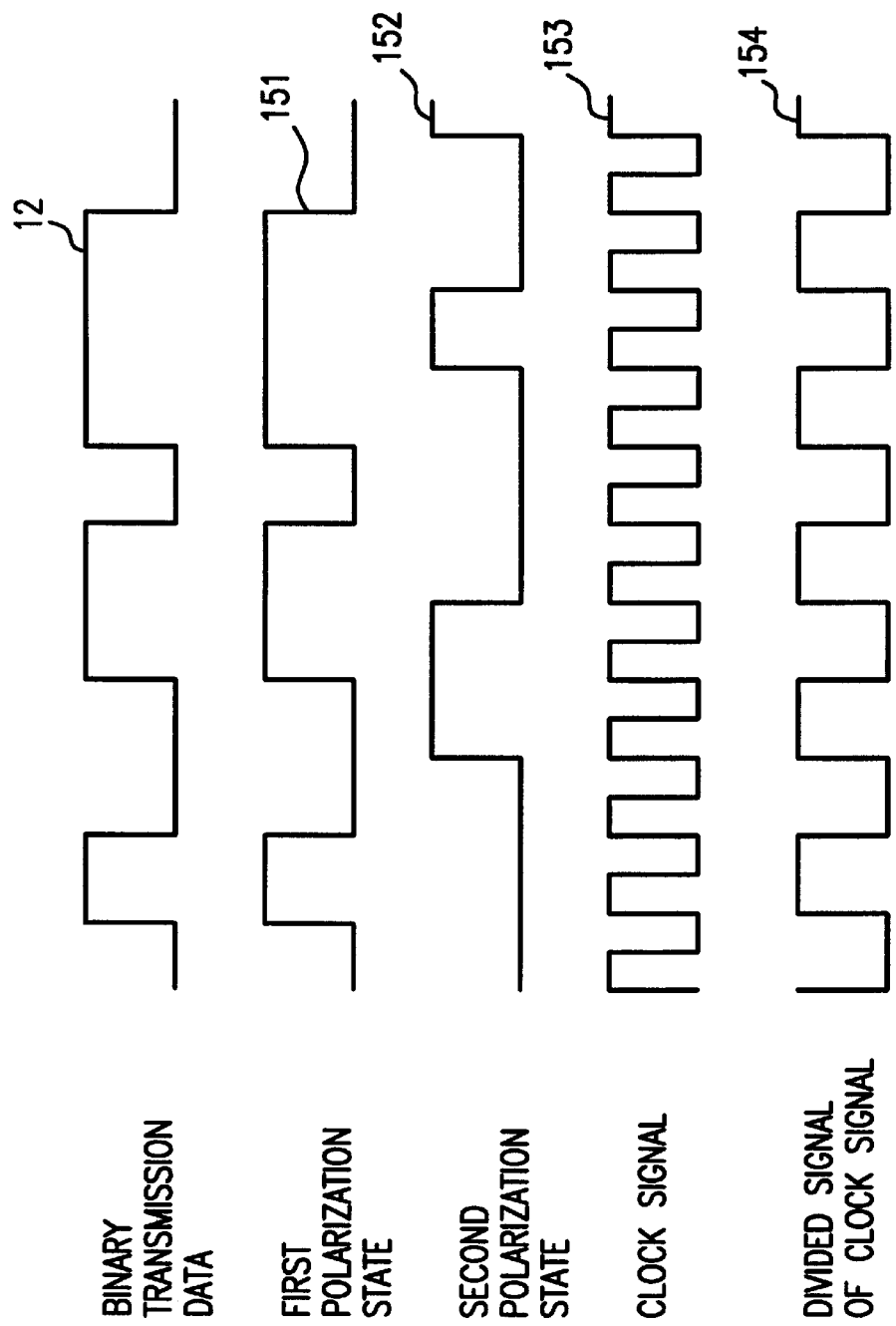
FIG. 15 is a waveform chart explaining one example of the optical wireless data communication system according to the present invention.

FIG. 15 is a view showing the binary transmission data 12 to be transmitted, a light intensity change 151 of the first polarization state and a light intensity change 152 of the second polarization state which correspond to the data. FIG. 15 also shows a clock signal 153 which will be the base for the time axis of the binary transmission data 12, and a divided clock signal 154 which is devided the clock signal by two. It is clear that the first polarization state is modulated in intensity based on the binary transmission data 12. On the other hand, the second polarization state is an exclusive OR of the divided clock signal 154 and the binary transmission data 12.

Figure 16:
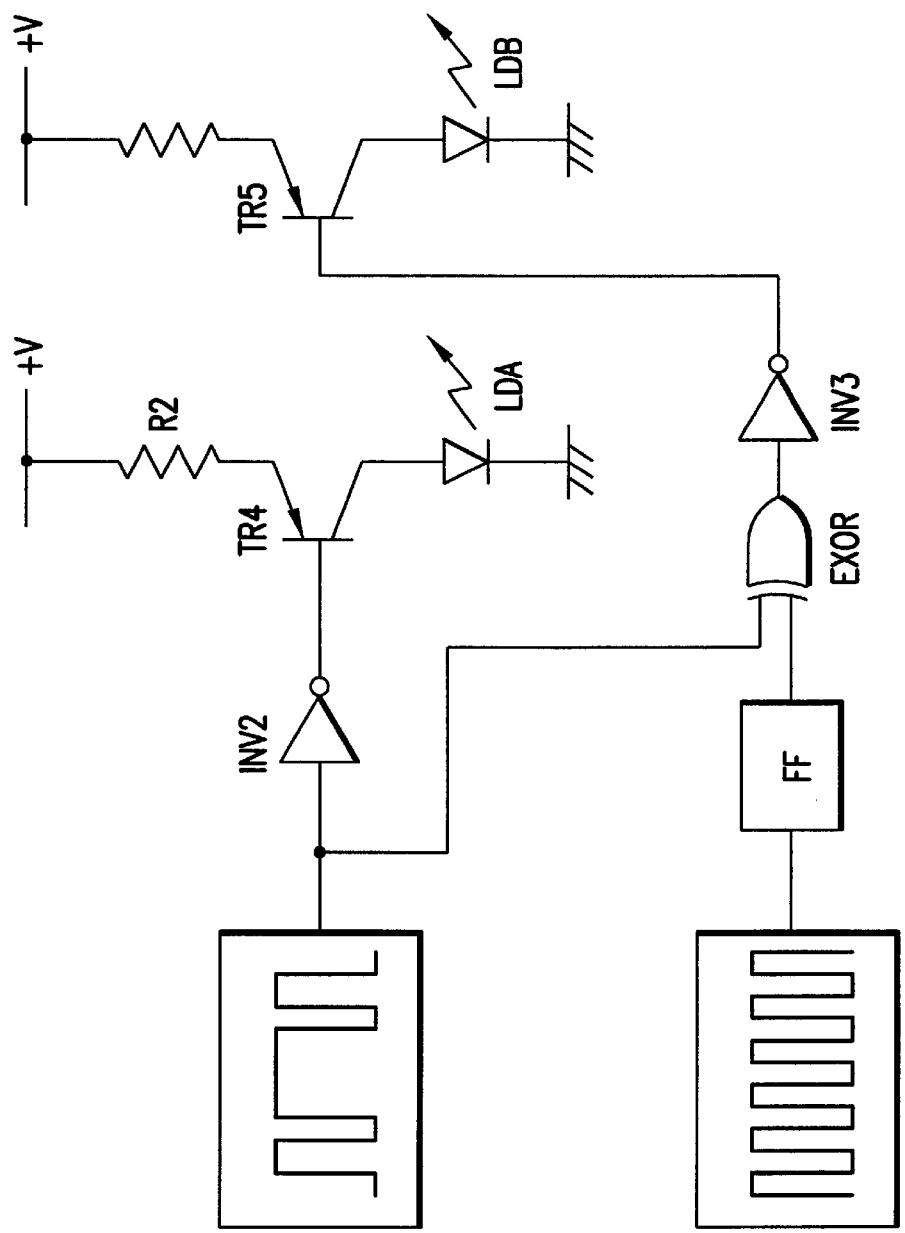
FIG. 16 is a circuit diagram showing one example of the transmitter used for the optical wireless data communication system according to the present invention.

The structure in FIG. 16 is used for emitting the intensity modulated light of such first polarization state and second polarization state. FIG. 16 is a circuit diagram for intensity modulating the surface-emitting lasers LDA and LDB based on the binary transmission data 12 and the clock signal 153. Here, the surface-emitting laser LDA emits light of a first polarization state, and the surface-emitting laser LDB emits light of a second polarization state. The binary transmission data 12 is inputted into inverter INV2, and the output of INV2 is connected with the gate of a transistor TR4. In other words, when the binary transmission data 12 is "1," the voltage at the gate of TR4 becomes lower than the voltage of the emitter, so TR4 is in an ON state, and current flows to the surface-emitting laser LDA. As a result, the surface-emitting laser LDA emits a laser beam of a first polarization state. The level of the current is determined by the resistance R2. If the binary transmission data 12 is "0," TR4 is in an OFF state, so no current flows and no laser beam is emitted.

Furthermore, the clock signal 153 is input into the ½ devider FF, and the output obtained is the divided clock signal 154. This signal and the binary transmission data 12 are input into the exclusive OR gate EXOR, and the output thereof rives the inverter INV3 and the transistor TR5, and is emitted as the laser beam output from the surface-emitting laser LDB.

Figure 13:
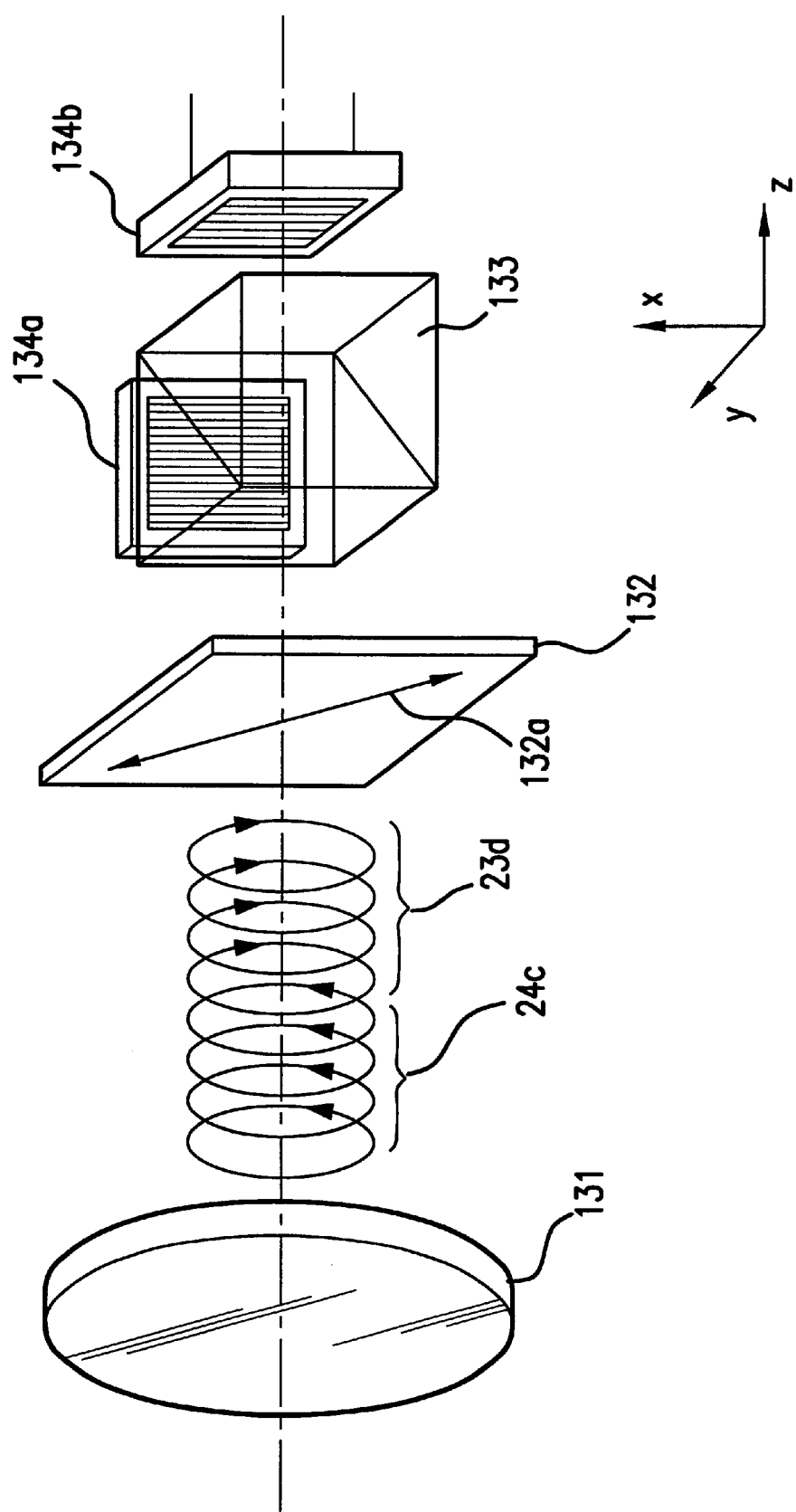
FIG. 13 is an abstract view showing the structure of one example of the receiver used for the optical wireless data communication system according to the present invention.
Figure 17:
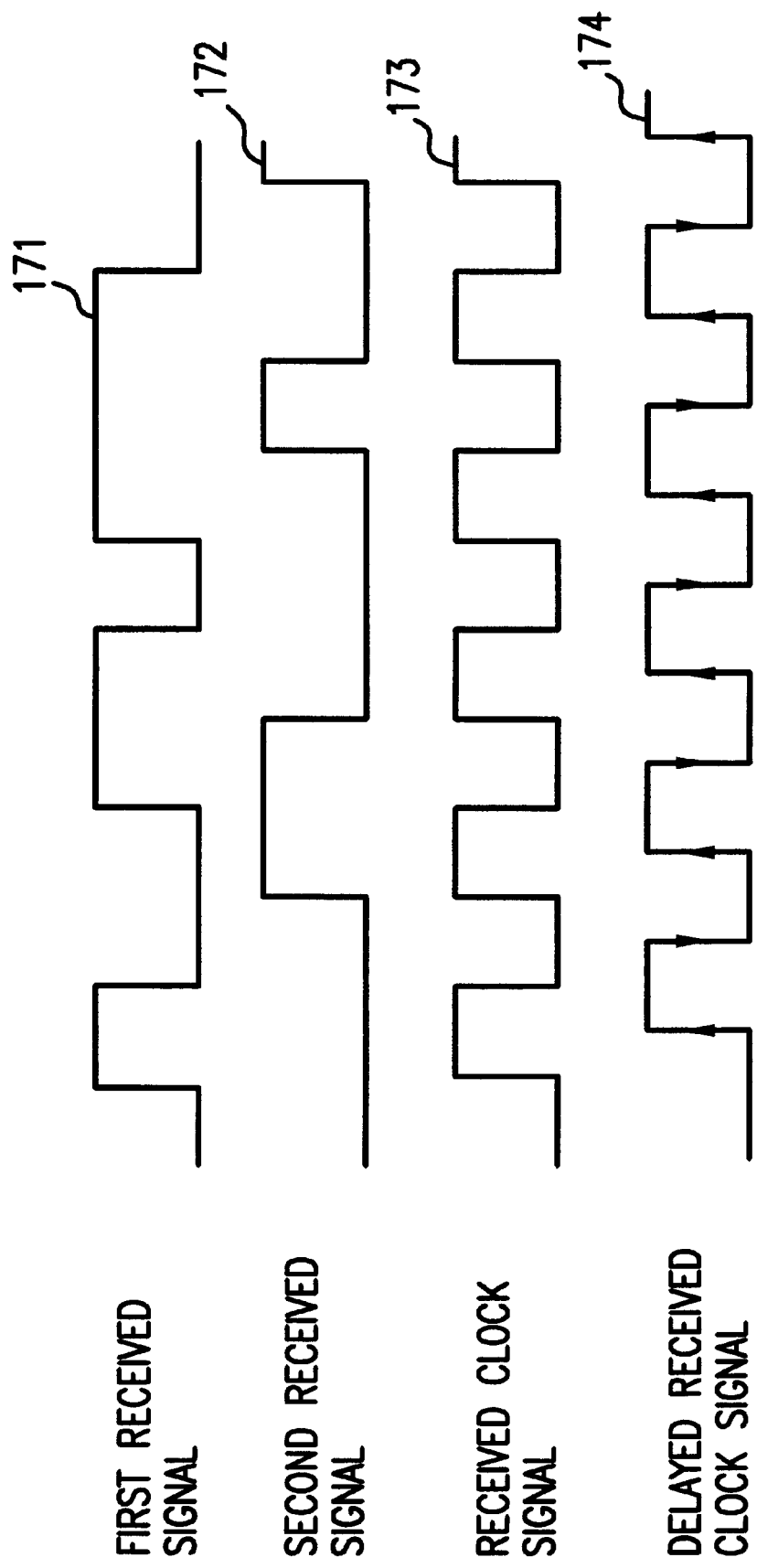
FIG. 17 is a waveform chart explaining one example of the optical wireless data communication system according to the present invention.
Figure 18:
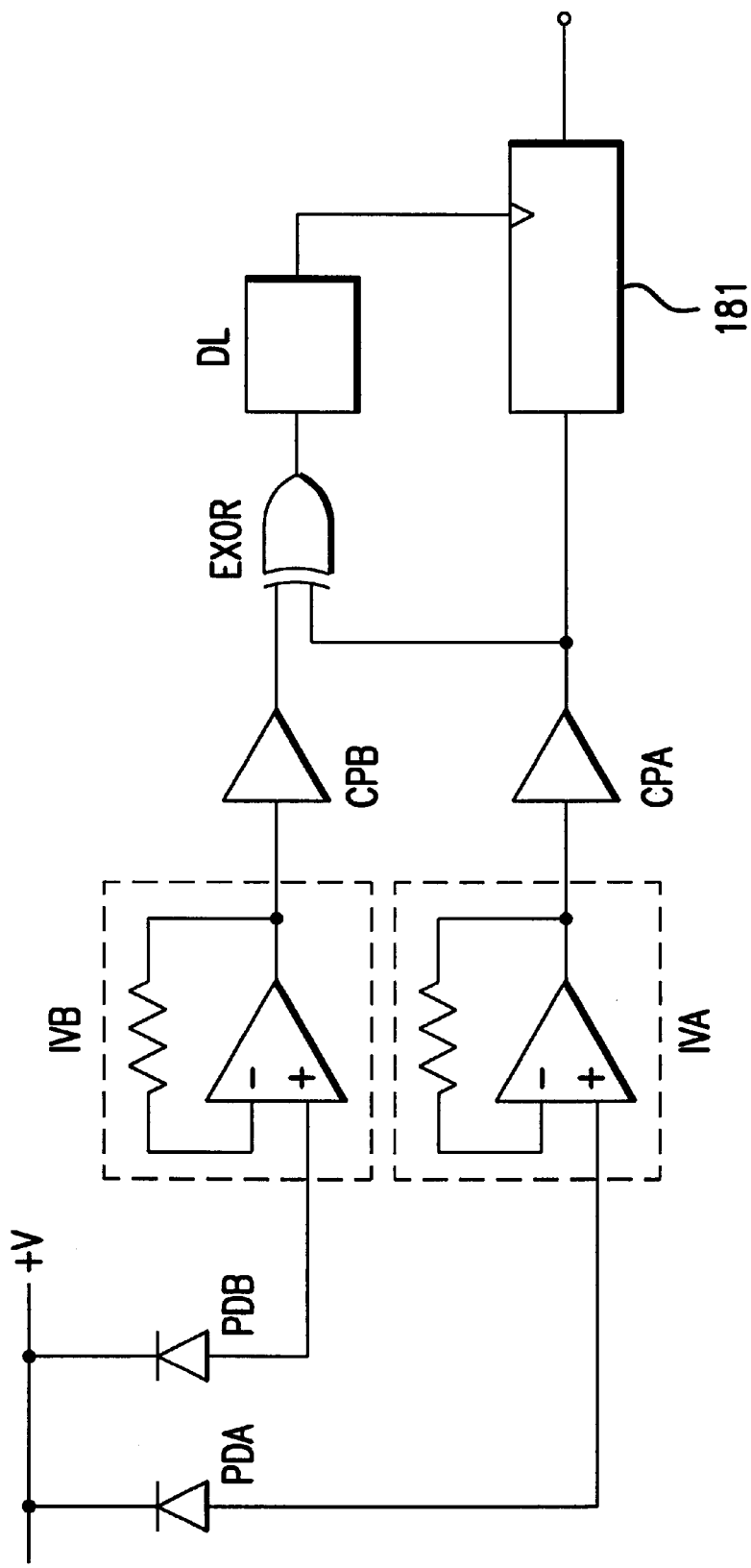
FIG. 18 is a circuit diagram showing one example of the receiver used for the optical wireless data communication system according to the present invention.

As described with the first embodiment in FIG. 13, the receiver separates light to the first polarization state and the second polarization state, and includes an optical system for converting their respective optical intensity values into electric signals. As a result, a first received signal 171 corresponding to the first polarization state is obtained as the output of the photodiode PDA, and a second received signal 172 which is the electric signal corresponding to the second polarization state is obtained as the output of the photodiode PDB, as shown in the waveform chart in FIG. 17 and the circuit diagram in FIG. 18. As the outputs of both photodiodes PDA and PDB are currents, each is converted into a voltage value through the current/voltage conversion circuits IVA and IVB, which is then input into the comparators CPA and CPN to obtain the binary signal. As the first received signal 171 corresponds to the transmission signal, the binary signal above need only be input into the data discriminator 181 to obtain digital data, but actually, clock data is needed for sampling the received signal 171 inside the data discriminator 181. Therefore, when the output of the comparators CPA and CPB are input into the exclusive OR gate EXOR for calculating the exclusive OR of the first received signal 171 and the second received signal 172, the original received clock signal 173 corresponding to the divided clock signal can be obtained. By delaying this signal by a fixed duration to generate delayed received clock signal 174 which is then input into the data discriminator 181, the output of the comparator CPA can be sampled at the rising edges or falling edges of this delayed clock signal, thereby obtaining the target binary received data 18.

In this way, a PLL circuit is not used for obtaining the clock data necessary for the data discriminator 181. Therefore, by omitting the circuit with high precision required as the PLL circuit and the stable power source needed for the PLL circuit, cost reduction can be achieved. As there is no need to extract the clock from the received signal, the process of encoding and decoding vias a special modulation code can be omitted, thereby enabling the provision of inexpensive optical wireless data communication.

Figure 19:
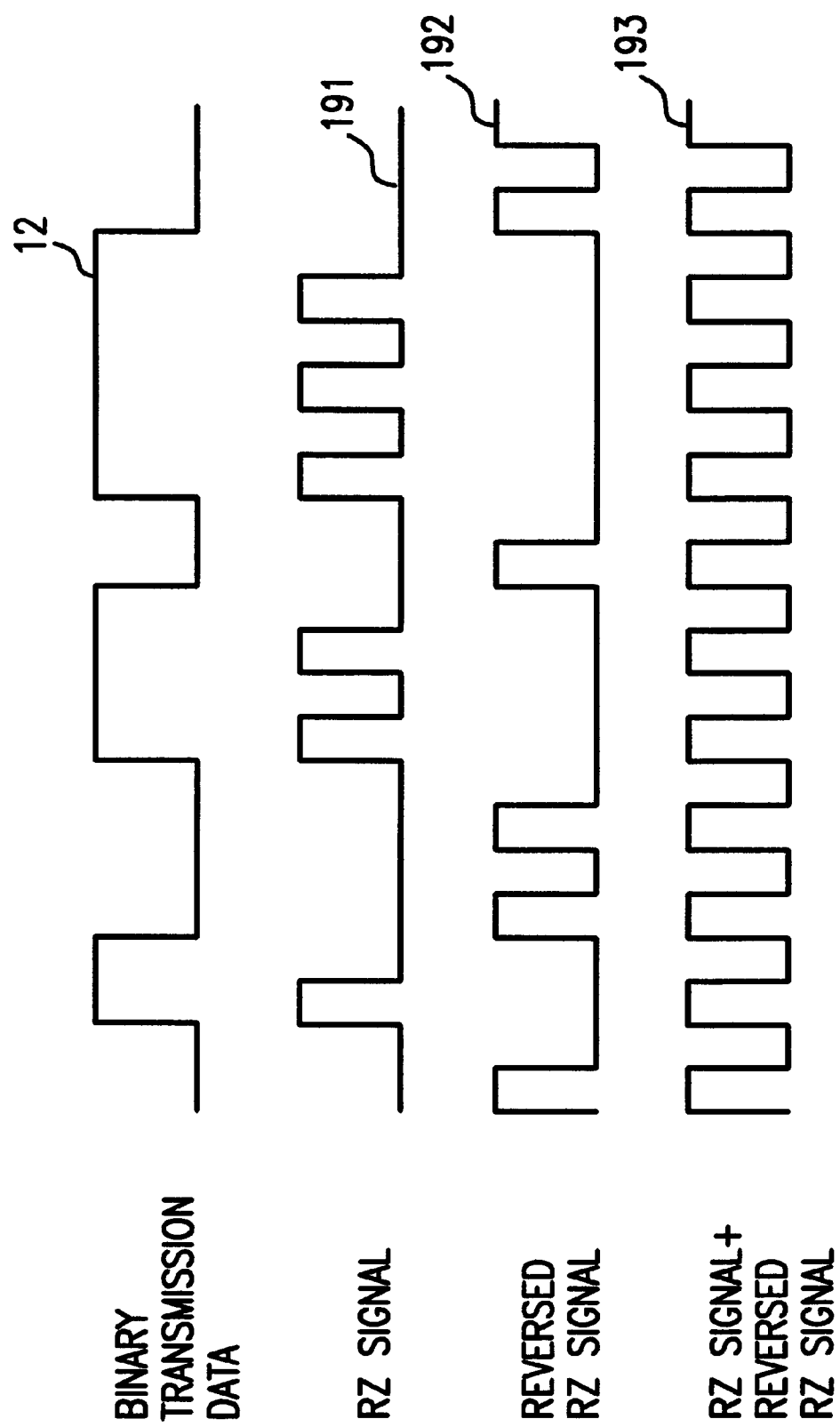
FIG. 19 is a waveform chart explaining one example of the optical wireless data communication system according to the present invention.

The system described below is also effective as a system which does not us a PLL circuit, namely the RZ (Return to Zero) code system. As shown in the waveform chart in FIG. 19, the RZ signal 191, which is the RZ encoded binary transmission data 12, temporarily transits to "1" when the binary transmission data "1," and thereafter always returns from the "1" state to the "0" state. The reversed RZ signal 192, which is the RZ encoded inversion of the binary transmission data 12, temporarily holds a "1" state when the binary transmission data is "0," and thereafter returns to "0." This RZ signal 191 and the inverse RZ signal 192 are respectively transmitted as changes in light intensity of the first polarization state and the second polarization state, respectively. For this process, a surface-emitting laser made to emit light of each of such polarization states need only be modulated based on the RZ signal 191 and the reversed RZ signal 192.

Figure 20:
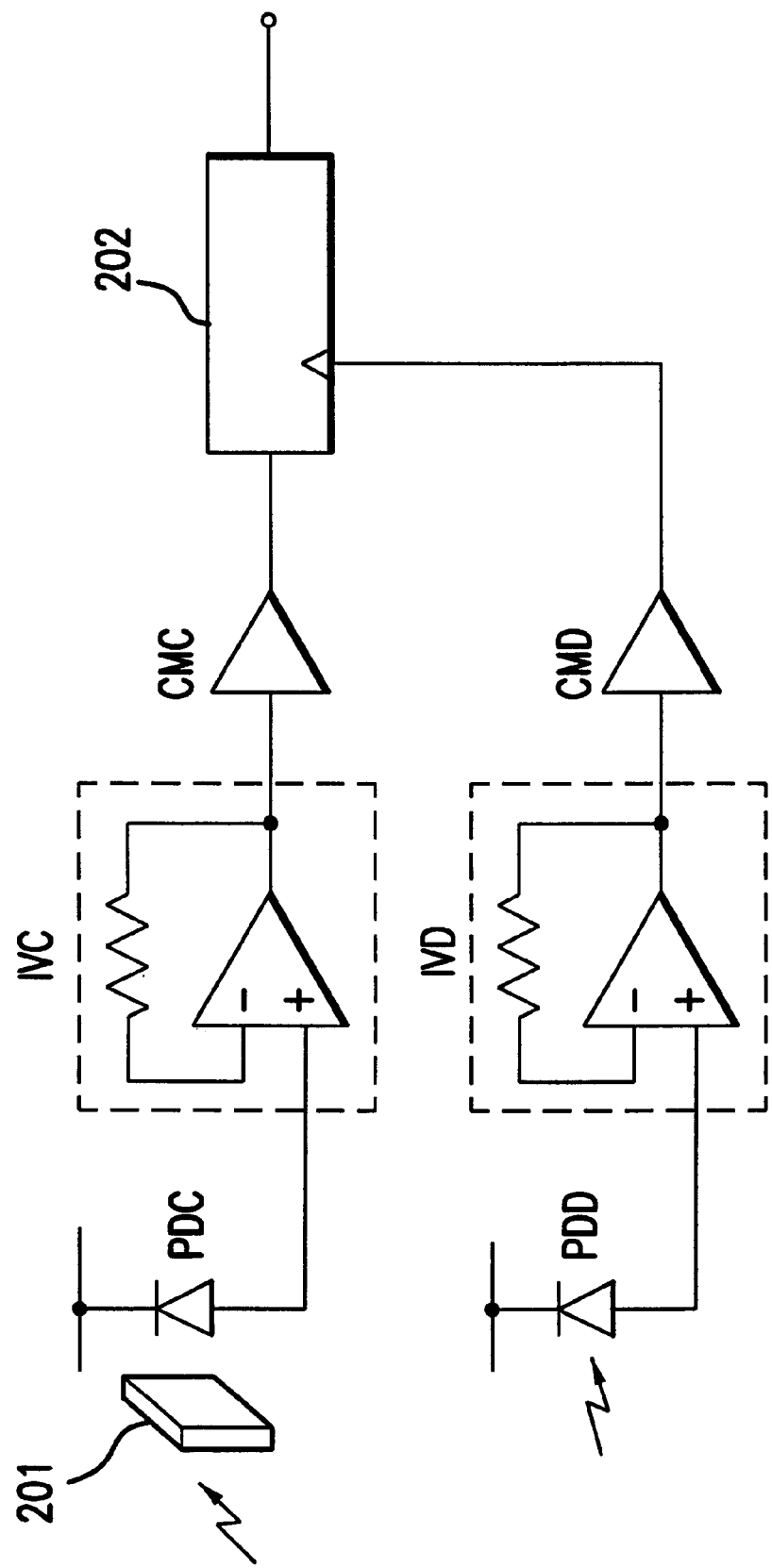
FIG. 20 is a circuit diagram showing one example of the receiver used for the optical wireless data communication system according to the present invention.

The receiver shown in FIG. 20 has a detecting part PDC for converting the intensity of the light passing through the polarization element 201 for separating the first polarization state into an electric signal, and a detecting part PDD for converting the light intensity into an electric signal regardless of the polarization state. In other words, the detecting part PDC generates electric signals corresponding to the RZ signal 191, and the detecting portion PDD generates electric signals corresponding to the sum signal 193 obtained by adding the RZ signal 191 and the reversed RZ signal 193. This sum signal 193 can be used as the clock necessary for sampling data. Therefore, the output of the detecting parts PPC and PPD pass through the current/voltage converters IVC and IVD, are binarized by comparators CMC and CMD, then input into the data discriminator 202 as the data and the clock, thereby obtaining a binary received data 13 synchronized with the clock.

In the example above, the sum signal 193 was obtained as the sum of light intensity values through a polarization-independent photodetector PDD. However, it is also possible to realize a similar receiver by performing photoelectric conversion of the light with an element for separation of polarized light, such as the photodetector PDC, then converting such converted light into an electric signal to calculate the sum signal 193 electrically.

Third Embodiment

A third embodiment provides a system for performing optical wireless communication using two or more types of light with different wavelengths. Particularly, one example will be explained in which the transmission data is transmitted as is by using one wavelength, and the data row of the reversion of the transmission data is transmitted by using the other wavelength.

Figure 21:
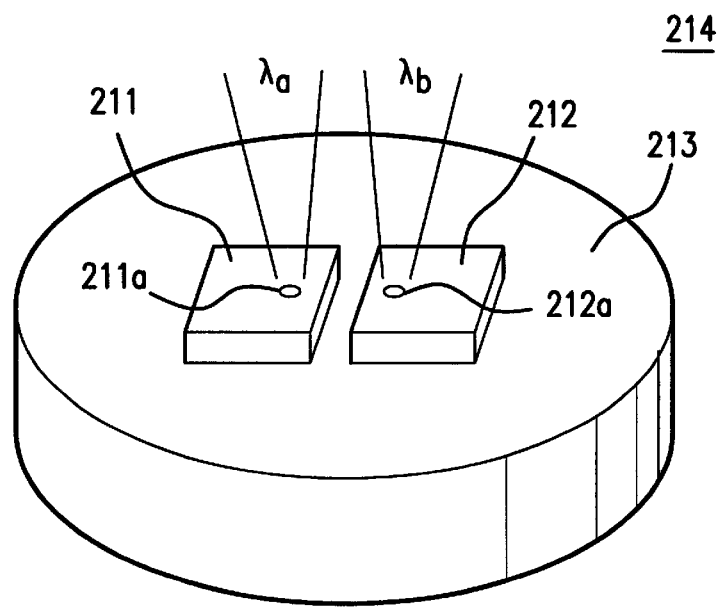
FIG. 21 is an abstract view of the vertical cavity surface-emitting laser module utilized as transmitter used for the optical wireless data communication system according to the present invention.

FIG. 21 is an abstract view showing the structure of a surface-emitting laser module 214 which can emit two types of wavelengths. Semiconductor chips 211 and 212 which have surface-emitting lasers 211a and 212a mounted on the same plane as the pedestal 213. As the surface-emitting laser emits laser beams vertical to the substrate, the semiconductor chips need only be mounted closely to each other on the same plane to easily align the directions of the emitted laser beams the same. The surface-emitting lasers 211a and 212a emit different wavelengths $\lambda a$ and $\lambda b$.

By modulating the current which flows through the surface-emitting lasers 211a and 212a above, the transmitter performs modulation of the intensity of the light of wavelength $\lambda a$ based on the binary transmission data 12, and modulation of the intensity of the light of wavelength $\lambda b$ based on the data row of the reversion of the binary transmission data 12, and emits two types of wavelengths $\lambda a$ and $\lambda b$ into the free space.

Figure 22:
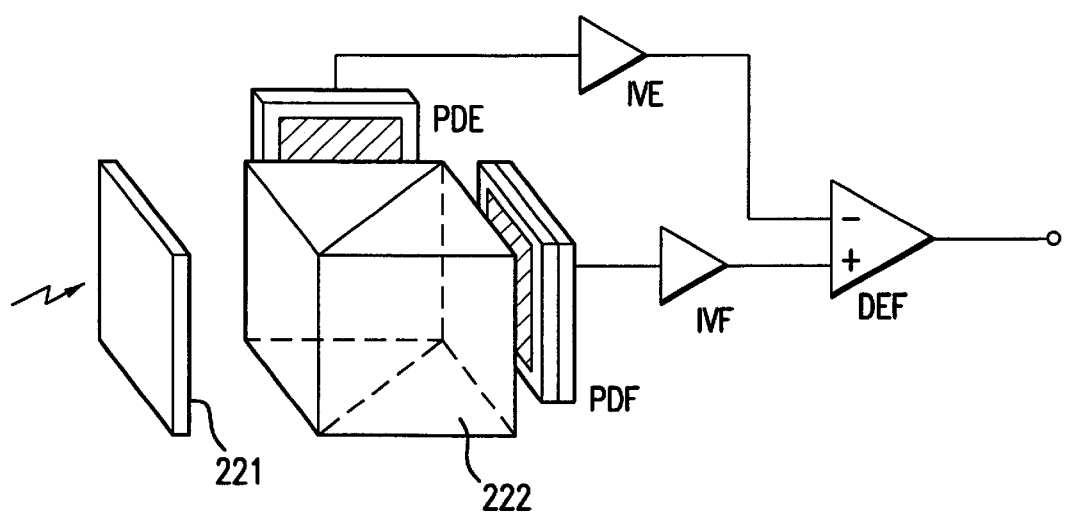
FIG. 22 is an abstract view of an example of the receiver used for the optical wireless data communication system according to the present invention.

The receiver shown in FIG. 22 includes a band pass filter 221, and a dichroic mirror 222 for separating the wavelengths $\lambda a$ and $\lambda b$. As a result, the wavelengths $\lambda a$ and $\lambda b$ are respectively guided to photodiodes PDE and PDF, and generate electric signals corresponding to their respective light intensity values. Not only he light emitted from the transmitter, but also the components of the disturbance light generated from the environment which pass through the band pass filter enter into the photodiodes PDE and PDF. In many cases, this disturbance light is white light, or colored light with a broad spectrum. In other words, these disturbance light beams have a light intensity spectrum which is independent of the wavelength within a range of 100 nm. Therefore, by setting the difference of the wavelengths $\lambda a$ and $\lambda b$ emitted from the surface-emitting lasers 211a and 212a, namely $|\lambda a - \lambda b|$, to 100 nm or less, the intensity of the disturbance light entering the photodiodes PDE and PDF can be approximately the same, and by obtaining the difference between their output values with a differential amplifier DEF, the disturbance light can be canceled. On the other hand, as both light beams of wavelengths $\lambda a$ and $\lambda b$ are modulated in mutually inverse phases via the transmitter, inputting the output of the photodiodes PDE and PDF into the differential amplifier will cause the modulated component to be amplified to an output with an amplitude of twice the gain. As a result, it is possible to obtain a received signal with an effective S/N rate by minimizing the influences of the disturbance light.

Fourth Embodiment

The fourth embodiment explained below provides a system for performing optical wireless data communication which uses two types of light with different wavelengths. The example below transmits transmission data and clock data by using two types of light with different wavelengths.

The transmitter used is a surface-emitting laser module 214 for emitting laser beams of the wavelengths $\lambda a$ and $\lambda b$ as shown in FIG. 21. The intensity of one of the surface-emitting lasers 211 a is modulated based on the binary transmission data 12, an the intensity of the other surface-emitting laser 212a is modulated based on the exclusive OR of the binary transmission data 12 and the divided clock signal 154. As a result, the transmitter emits light signals obtained by individually modulating wavelengths λa and λb into the free space.

The receiver uses an optical system similar to that shown in FIG. 22. However, after the photoelectric conversion at the photodetectors PDE and PDF and the conversion into voltage values at the current/voltage converters IVE and IVF, the system differs from that in FIG. 22. The current/voltage converter IVE outputs voltage proportional to the light intensity of λa. This output is converted into a binary signal by a comparator, and then input into a data discriminator 181. Furthermore, after the output of current/voltage converters IVE and IVF are converted into binary signals by the comparator, the exclusive OR of both signals is calculated by the exclusive OR gate to obtain the received clock signal 173. When the received clock signal 173 is delayed by a fixed duration to generate a delayed received clock signal 174 which is then input into the data discriminator 181, the target binary received data 18 can be obtained by sampling the original comparator output with the rise and the timing of the rise of this signal.

Furthermore, it is clear from the above description that another possible similar system for optical wireless data communication modulates the intensity of the surface-emitting lasers 211a and 211b based on the RZ signal 191, which is the RZ modulated binary transmission data 12, and the inverse RZ signal 192, respectively.

As described above, the present invention realizes optical wireless data communication between a transmitter for modulating the polarization state based on binary data, and a receiver for detecting changes in the polarization state, so that it can provide an inexpensive optical wireless data communication system which is little influenced by disturbing light, which does not influence existing optical wireless communication systems, and which is not influenced by existing optical wireless communication systems. Particularly, the optical wireless data communication system according to the present invention does not interfere with the IrDA system even if it performs polarized light modulation communication using the wavelength band from 850 nm to 900 nm used by the IrDA system. Therefore, it is possible to use an AlGaAs semiconductor laser growing on a GaAs substrate as the light-emitting element used for the transmitter, and thereby provide an inexpensive transmitter. It is also possible to use a PIN photodiode made of silicon which can use wavelengths of 1 $\mu$m or less as the light-accepting element of the receiver, thereby providing an inexpensive receiver. In this way, the optical wireless data communication system according to the present invention is superior regarding the cost when using a wavelength of 1 $\mu$m or less, but the present invention also provides many superior effects regarding all wavelength bands, including wavelengths of 1 $\mu$m or more. As disturbing light which causes disturbance is mostly unpolarized, the present invention can provide stable communication by removing these influences. Furthermore, according to the optical wireless data communication system of the present invention, the optical output from the transmitter is DC light of the peak values of the output optical components are the same, so that in comparison to light with modulated intensity, twice the output can be obtained on an average level. As a result, the number of photons can be increased to twice the number, so that it is possible to increase the S/N ratio by approximately 3dB. The polarization states used for the present invention may be an arbitrary combination of "independent polarization states." Among thee combinations, the pair formed by counterclockwise and clockwise circularly polarized light beams is particularly effective as there is no change in the transmission and receiving states during the rotation around the communication azimuths of the transmitter and receiver. A transmitter for modulating a circularly polarized light can be realized easily through the combination of a modulated linearly polarized light-emitting element and a quarter-wave plate. Particularly the use of surface-emitting lasers as the modulated linearly polarized light-emitting element is effective for simplifying the structure of the device. A surface-emitting laser has a large degree of freedom regarding the direction of polarization, and the direct modulation of the polarization direction is possible, so the transmitter can be provided at a low cost. Furthermore, a high-speed modulation of the plane of polarization is easily possible with the system of performing modulation by using a plurality of surface-emitting lasers with fixed direction of polarization, so it is possible to provide a high speed and large capacity optical wireless data communication. By emitting communication light from a plurality of surface-emitting lasers, the optical output can be increased, and the safety to the naked eye can be enhanced. The receiver for receiving the electromagnetic wave with a modulated direction of rotation of the circularly polarized light can be realized through the combination of a quarter-wave plate, an analyzer and a photodetecting element. This receiver can remove same phase components corresponding to the entering unpolarized light through differential detection, so that the reproduction of a stable polarized modulated signal is possible.

As described above, the optical wireless data communication system and the transmitter and receiver used therefor according to the present invention provides stable wireless data communication which does not interfere with conventional systems at low costs.

When complementarily modulating light with two different wavelengths, same phase components can be removed through differential detection, so that reproduction of a stable modulated signal is possible. In other words, an inexpensive optical wireless data communication system can be provided which is little affected by disturbing light, which does not affect existing optical wireless communication systems, and which is not affected by existing optical wireless communication systems.

By using light with two different polarization states or wavelengths, the data to be transmitted and the clock data are propagated along space, so that data discrimination is possible without the use of a PLL circuit. Therefore, the cost can be reduced by omitting the high precision PLL circuit and the stable power source required for the PLL circuit. As there is no need for extracting a clock from the received signal, the encoding and decoding via a special modulation code can be omitted, thereby providing inexpensive optical wireless data communication.

Particularly, the use of surface-emitting lasers which emit two types of light which differ in the polarization state or the wavelength provides a compact device, and the optical axis can be adjusted easily, thereby providing a transmitter according to the present invention at low costs.

We claim:

1. An optical wireless data communication system for performing communication by emitting light of a wavelength of 100 $\mu$m or less into free space, comprising:

a transmitter having one or more light sources for emitting two or more types of light with mutually differing optical characteristics, said transmitter comprising an emitting means for individually modulating said two or more types of light based on first transmission data obtained by modulating the transmission data and second transmission data obtained by calculating and converting the transmission data, and emitting two or more mutually differing modulated signal light beams; and a receiver having one or more light-accepting portions for discriminating and accepting said two or more types of light, said receiver comprising a received data acquiring means for acquiring received data corresponding to said transmission data from the results of the calculation of the modulated signals obtained by accepting said modulated signal light which has propagated along free space.

2. An optical wireless data communication system according to claim 1, wherein aid transmission data is used as said first transmission data and a data row of the reversion of said transmission data is used as said second transmission data.

3. An optical wireless data communication system according to claim 1, wherein the exclusive OR of the half wave signal of the clock and said transmission data is used as said second transmission data.

4. An optical wireless data communication system according to claim 1, wherein a data row obtained by RZ modulating said transmission data is used as said first transmission data, and a data row obtained by RZ modulating the reversion of said transmission data is used as said second transmission data.

5. An optical wireless data communication system according to claim 1, wherein a combination of linearly polarized light beams in crossing directions is used as said two or more types of light with mutually differing optical characteristics.

6. An optical wireless data communication system according to claim 1, wherein clockwise and counterclockwise circularly polarized light beams are used as said two or more types of light with mutually differing optical characteristics.

7. An optical wireless data communication system according to claim 1, wherein a combination of light beams with different wavelengths is used as said two or more types of light with mutually differing optical characteristics.

8. A transmitter used for an optical wireless data communication system performing communication by emitting light of a wavelength of 100 $\mu$m or less into free space, and which comprises one or more light sources for emitting two or more types of light with mutually differing optical characteristics, said light source comprising a vertical cavity surface-emitting semiconductor laser for modulating the direction of polarization of linearly polarized light and a phase plate arranged to transmit the light emitted from said vertical cavity surface-emitting semiconductor laser.

9. A transmitter according to claim 8, wherein a quarter-wave plate is used as said phase plate, the direction of the main axis of said quarter-wave plate being arranged to form an angle of 45 degrees with the plan of polarization of the light emitted from said first or second semiconductor lasers.

10. A transmitter used for an optical wireless data communication system performing communication by emitting light of a wavelength of 100 $\mu$m or less into free space, and which comprises one or more light sources for emitting two or more types of light with mutually differing optical characteristics, said light source comprising a first semiconductor laser for emitting a first linearly polarized light, a second semiconductor laser for emitting a second linearly polarized light vertical to the plane of polarization of the light emitted from said first semiconductor laser, and a phase plate arranged to transmit the light emitted from said first and second semiconductor lasers.

11. A transmitter according to claim 10, wherein vertical cavity surface-emitting semiconductor lasers formed on the same semiconductor substrate are used as said first and second semiconductor lasers.

12. A transmitter according to claim 11, wherein a plurality of vertical cavity surface-emitting semiconductor lasers which are said first semiconductor lasers, and plurality of vertical cavity surface-emitting semiconductor lasers which are said second semiconductor lasers are formed on the same semiconductor substrate.

13. A transmitter according to claim 11, wherein said first and second semiconductor lasers are vertical cavity surface-emitting semiconductor lasers which have resonators with a rectangular cross section and a long side which is at least 1.2 times the short side, the directions of the long sides of the first and second semiconductor lasers being arranged to be crossing directions.

14. A receiver used for an optical wireless data communication system performing communication by emitting light of a wavelength of 100 $\mu$m or less into free space, comprising:

a receiving phase plate for converting polarization state of received light into linearly polarized light beams with crossing directions;

an analyzer for transmitting or reflecting each of the linearly polarized light beams with crossing directions; and a first and second light-accepting element for photoelectrically converting each of the linearly polarized light beams with crossing directions.

15. A receiver according to claim 14, wherein a quarter-wave plate is used as said receiving phase plate, and the direction of the main axis of said quarter-waver plate is arranged to form an angle of 45 degrees with the optical axis of said analyzer.

16. A receiver according to claim 14, wherein PIN photodiodes are used as said first and second light-accepting elements.

* * * * *